(12) United States Patent
Uemura et al.

(10) Patent No.: US 8,875,577 B2
(45) Date of Patent: Nov. 4, 2014

(54) OSCILLATOR CIRCUIT, METHOD FOR MANUFACTURING OSCILLATOR CIRCUIT, INERTIAL SENSOR USING THE OSCILLATOR CIRCUIT, AND ELECTRONIC DEVICE

(75) Inventors: Takeshi Uemura, Osaka (JP); Keisuke Kuroda, Osaka (JP)

(73) Assignee: Panasonic Corporation, Osaka (JP)

( * ) Notice: Subject to any disclaimer, the term of this patent is extended or adjusted under 35 U.S.C. 154(b) by 305 days.

(21) Appl. No.: 13/143,570

(22) PCT Filed: Feb. 12, 2010

(86) PCT No.: PCT/JP2010/000857
§ 371 (c)(1),
(2), (4) Date: Jul. 7, 2011

(87) PCT Pub. No.: WO2010/092816
PCT Pub. Date: Aug. 19, 2010

(65) Prior Publication Data
US 2011/0285444 A1   Nov. 24, 2011

(30) Foreign Application Priority Data

Feb. 13, 2009  (JP) ................................ 2009-030788
Mar. 9, 2009   (JP) ................................ 2009-054537

(51) Int. Cl.
| | |
|---|---|
| *G06F 1/04* | (2006.01) |
| *H05K 3/30* | (2006.01) |
| *G01C 19/5726* | (2012.01) |
| *G01C 19/5614* | (2012.01) |
| *G01C 19/5776* | (2012.01) |
| *H03B 5/32* | (2006.01) |

(52) U.S. Cl.
CPC ........ *G01C 19/5726* (2013.01); *G01C 19/5614* (2013.01); *G01C 19/5776* (2013.01); *H03B 5/32* (2013.01)
USPC .................................................... 73/514.01

(58) Field of Classification Search
CPC ............ G06F 1/04; H05K 3/30; G01P 15/18; G01P 15/125; G01P 15/0802; G01P 15/123; G01P 15/0891
USPC ....................................................... 73/514.01
See application file for complete search history.

(56) References Cited

U.S. PATENT DOCUMENTS

| | | | |
|---|---|---|---|
| 5,444,639 A | 8/1995 | White | |
| 5,561,400 A | 10/1996 | Iguchi et al. | |

(Continued)

FOREIGN PATENT DOCUMENTS

| | | |
|---|---|---|
| CN | 1762091 A | 4/2006 |
| GB | 2293880 A | 4/1996 |

(Continued)

OTHER PUBLICATIONS

International Search Report for PCT/JP2010/000857, May 18, 2010.

(Continued)

*Primary Examiner* — Hezron E Williams
*Assistant Examiner* — Gregory J Redmann
(74) *Attorney, Agent, or Firm* — RatnerPrestia

(57) ABSTRACT

An oscillator circuit includes an oscillator, a filter that filters a monitoring signal output from the oscillator and outputs the filtered signal, a driver that amplifies the filtered signal to generate a driving signal, and a controller operable to control a passing characteristic of the filter based on the monitoring signal. The oscillator performs a vibration while being driven by the driving signal, and outputs the monitoring signal according to the vibration. This oscillator circuit allows the oscillator to vibrate stably.

15 Claims, 21 Drawing Sheets

(56) References Cited

U.S. PATENT DOCUMENTS

| | | | |
|---|---|---|---|
| 6,412,347 B1 | 7/2002 | Kuroda et al. | |
| 6,943,636 B2 * | 9/2005 | Moore | 331/117 FE |
| 2006/0244542 A1 * | 11/2006 | Knoll et al. | 331/16 |
| 2007/0035344 A1 | 2/2007 | Kobayashi | |
| 2009/0007663 A1 * | 1/2009 | Uemura | 73/504.15 |

FOREIGN PATENT DOCUMENTS

| | | |
|---|---|---|
| JP | 03-159877 A | 7/1991 |
| JP | 08-105747 A | 4/1996 |
| JP | 2000-088581 A | 3/2000 |
| JP | 2000-241166 A | 9/2000 |
| JP | 2002-188921 A | 7/2002 |

OTHER PUBLICATIONS

Supplementary European Search Report for Application No. EP 10741096 issued Oct. 22, 2013.

Search Report for Application No. 2010800054105 issued Jul. 30, 2013.

* cited by examiner

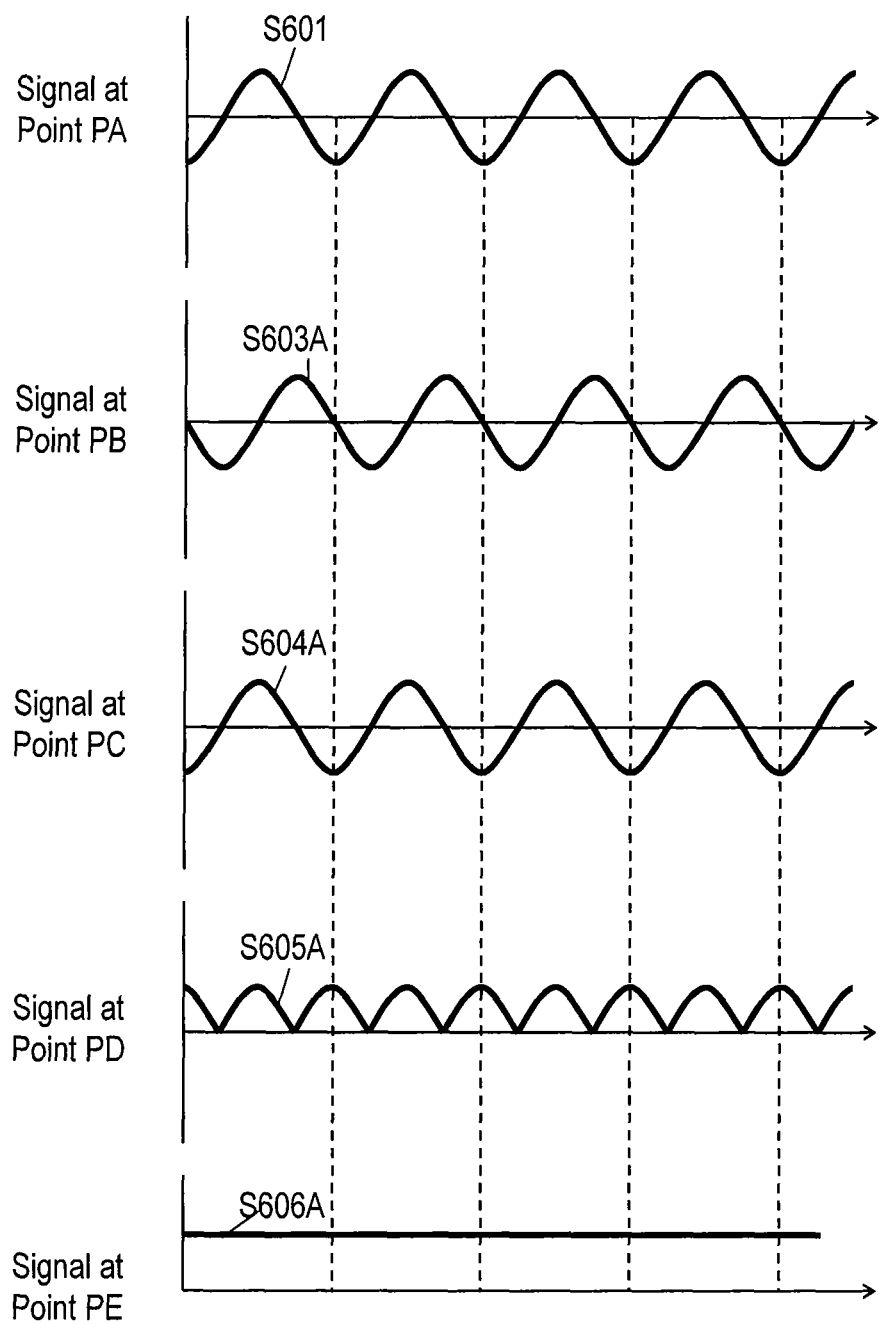

OSCILLATOR CIRCUIT, METHOD FOR MANUFACTURING OSCILLATOR CIRCUIT, INERTIAL SENSOR USING THE OSCILLATOR CIRCUIT, AND ELECTRONIC DEVICE

This application is a U.S. NATIONAL PHASE APPLICATION OF PCT INTERNATIONAL APPLICATION No.PCT/JP2010/000857.

TECHNICAL FIELD

The present invention relates to an oscillator circuit, a method of manufacturing the oscillator circuit, and an inertial sensor including the oscillator circuit.

BACKGROUND ART

FIG. 25 is a circuit block diagram of conventional oscillator circuit 130 disclosed in Patent Literature 1. Oscillator circuit 130 includes oscillator 131, filter 132, and driver 133. Filter 132 receives a monitoring signal output from oscillator 131 and outputs the filtered signal to driver 133. Receiving the filtered signal, driver 133 amplifies the filtered signal and outputs a driving signal to oscillator 131. The monitoring signal contains an undesired frequency signal caused by a high-order vibration frequency of the vibration mode of oscillator 131 or caused by a vibration mode different from the driving vibration mode. Filter 132 suppresses the undesired frequency signal.

Oscillator 131 is made of crystal or other piezoelectric material with high processing accuracy, and generally, has small variations in the driving vibration frequency caused by variations in processing accuracy. However, in the case that oscillator 131 has a small size, oscillator 131 has variations in processing accuracy which greatly affect the driving vibration frequency. Oscillator 131 vibrating in plural vibration modes other than the driving vibration mode has large variations in processing accuracy, accordingly, increasing variations in the driving vibration frequency.

An oscillator made of silicon has frequency-temperature characteristics inferior to those of an oscillator made of crystal. That is, the driving vibration frequency of oscillator 131 is affected by an ambient temperature thereof.

Besides, the driving vibration frequency of oscillator 131 can be changed due to aging degradation.

In conventional oscillator circuit 130, however, the passing characteristic of filter 132 cannot optimized for variations in the driving vibration frequency caused by variations in processing accuracy of oscillator 131, changes in the driving vibration frequency caused by the ambient temperature and the aging degradation.

FIG. 26 is a circuit block diagram of conventional inertial sensor 620 disclosed in Patent Literature 2. Inertial sensor 620 includes oscillator 621, driver 622, detector circuit 623, and abnormal-state detector 624. Receiving a monitoring signal from oscillator 621, driver 622 amplifies the monitoring signal and transmits a driving signal to oscillator 621. Detecting a sensing signal output from oscillator 621, detector circuit 623 outputs the sensing signal to output terminal 625. Abnormal-state detector 624 outputs an abnormal-state detection signal to diagnostic terminal 626 based on the monitoring signal. Oscillator 621 outputs the sensing signal according to an amount of inertia applied from the outside of the oscillator. Detecting the sensing signal, detector circuit 623 outputs the sensing signal to output terminal 625. Abnormal-state detector 624 has detector section 624A and window comparator 624B. Detector 624A outputs an amplitude of the monitoring signal. Receiving the amplitude, window comparator 624B determines whether or not the amplitude is within a predetermined range between upper threshold VR501 and lower threshold VR502. If the amplitude is not less than upper threshold VR501 or not more than lower threshold VR502, window comparator 624B outputs the abnormal-state detection signal to diagnostic terminal 626. That is, if the amplitude of the monitoring signal is out of the predetermined range between upper threshold VR501 and lower threshold VR502, abnormal-state detector 624 determines that oscillator 621, i.e., inertial sensor 620, is in an abnormal state and outputs the abnormal-state detection signal to diagnostic terminal 626.

If inertial sensor 620 has a large impact from outside, the amplitude of the monitoring signal generally exceeds upper threshold VR501 temporarily, and therefore, abnormal-state detector 624 outputs the abnormal-state detection signal. If oscillator 621 stops oscillating due to braking of wire or other problems, the amplitude becomes smaller than lower threshold VR502. In this case, abnormal-state detector 624 also outputs the abnormal-state detection signal. An electronic device including inertial sensor 620 can determine that the amount of inertia which is obtained based on the sensing signal and which is output from output terminal 625 is not reliable while the abnormal-state detection signal is output from diagnostic terminal 626.

Abnormal-state detector 624 determines the abnormal state based on the amplitude of the monitoring signal. If oscillator 621 performs an abnormal oscillation, detector 624 may fail to output the abnormal-state detection signal. For example, when oscillator 621 performs an abnormal oscillation having a harmonic frequency of a driving vibration frequency or other natural resonance frequencies, oscillator 621 may maintain the vibration. In this case, the amplitude of the monitoring signal is remained constant. Besides, when the amplitude is remained within the predetermined range, no abnormal-state detection signal is output from abnormal-state detector 624. While vibrating in such abnormal oscillation state, inertial sensor 620 fails to output a proper sensing signal according to motion applied from the outside, hence degrading the reliability of the amount of inertia due to the inaccurate sensing signal output from output terminal 625.

CITATION LIST

Patent Literature
Patent Literature 1: Japanese Patent Laid-Open Publication No.2000-88581
Patent Literature 2: Japanese Patent No.2504233

SUMMARY OF THE INVENTION

An oscillator circuit includes an oscillator, a filter that filters a monitoring signal output from the oscillator and outputs the filtered signal, a driver that amplifies the filtered signal to generate a driving signal, and a controller operable to control a passing characteristic of the filter based on the monitoring signal. The oscillator performs a vibration while being driven by the driving signal, and outputs the monitoring signal according to the vibration.

This oscillator circuit allows the oscillator to vibrate stably.

BRIEF DESCRIPTION OF THE DRAWINGS

FIG. 22A shows waveforms of signals of the detector circuit in accordance with Embodiment 5.

DETAILED DESCRIPTION OF PREFERRED EMBODIMENTS

Exemplary Embodiment 1

Figure 1:
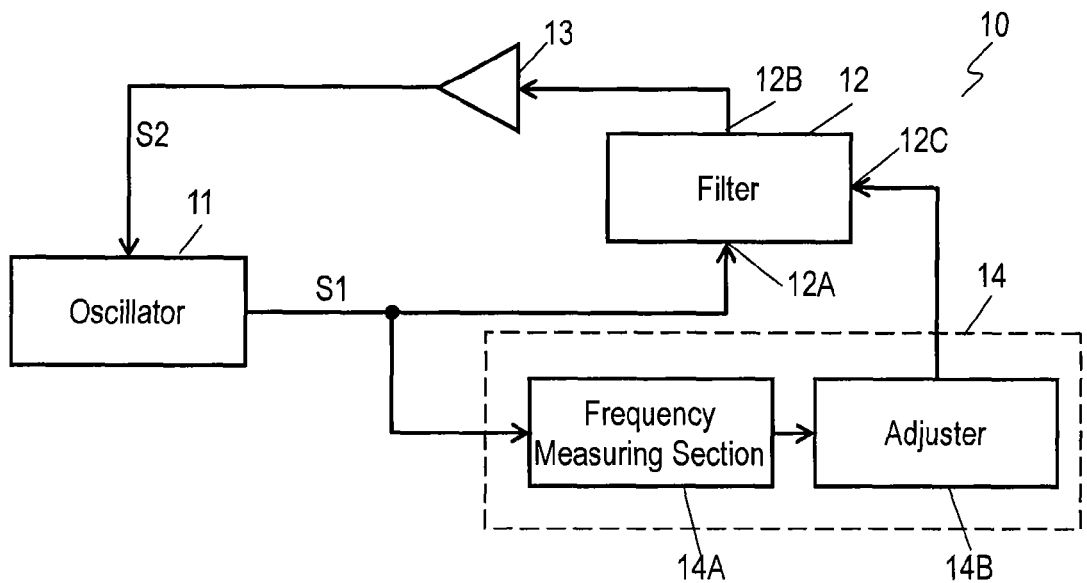
FIG. 1 is a circuit block diagram of an oscillator circuit in accordance with Exemplary Embodiment 1 of the present invention.

FIG. 1 is a circuit block diagram of oscillator circuit 10 in accordance with Exemplary Embodiment 1 of the present invention. Oscillator circuit 10 includes oscillator 11, filter 12, driver 13, and controller 14. Filter 12 receives monitoring signal S1 output from oscillator 11. Driver 13 supplies driving signal S2 to oscillator 11. Controller 14 controls a passing characteristic of filter 12 based on monitoring signal S1. Driven by driving signal S2 output from driver 13, oscillator 11 performs a vibration at a driving vibration frequency. Oscillator 11 outputs monitoring signal S1 according to the vibration. Monitoring signal S1 has a frequency identical to the driving vibration frequency. Filter 12 filters monitoring signal S1 input to input port 12A, and output the filtered signal. The filtered signal is output from output port 12B. The passing characteristic of filter 12 is controlled by a control signal input to control terminal 12C. Driver 13 amplifies the filtered signal to generate driving signal S2. Controller 14 includes frequency measuring section 14A and adjuster 14B. Frequency measuring section 14A measures the driving vibration frequency of oscillator 11 based on monitoring signal S1. Adjuster 14B adjusts the passing characteristic of filter 12 based on the driving vibration frequency measured by frequency measuring section 14A.

Figure 2:
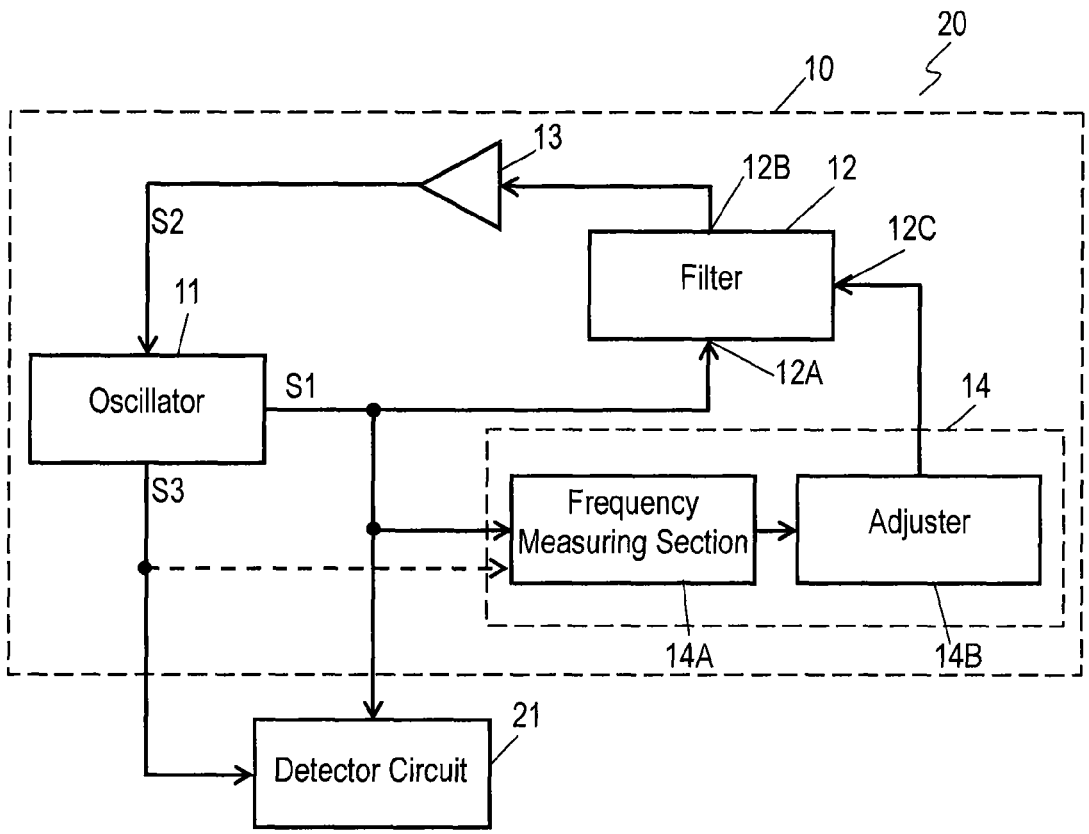
FIG. 2 is a circuit block diagram of an angular velocity sensor in accordance with Embodiment 1.

FIG. 2 is a circuit block diagram of inertial sensor 20, an angular velocity sensor that includes oscillator circuit 10. Inertial sensor 20 includes oscillator circuit 10 shown in FIG. 1 and detector circuit 21 for detecting sensing signal S3 output from oscillator 11. In inertial sensor 20, oscillator 11 outputs sensing signal S3 according to an angular velocity, an amount of inertia applied from outside of oscillator 11. Driven by driving signal S2, oscillator 11 performs a vibration in a driving vibration mode at a driving vibration frequency. Oscillator 11 also vibrates in a sensing vibration mode different from the driving vibration mode. An exciting force of an angular velocity as the amount of inertia provided from outside causes oscillator 11 to vibrate on the sensing vibration mode, and outputs sensing signal S3. Using monitoring signal S 1, detector circuit 21 synchronously detects sensing signal S3 and outputs a signal corresponding to sensing signal S3. Thus, inertial sensor 20 detects the angular velocity applied to oscillator 11.

Figure 3A:
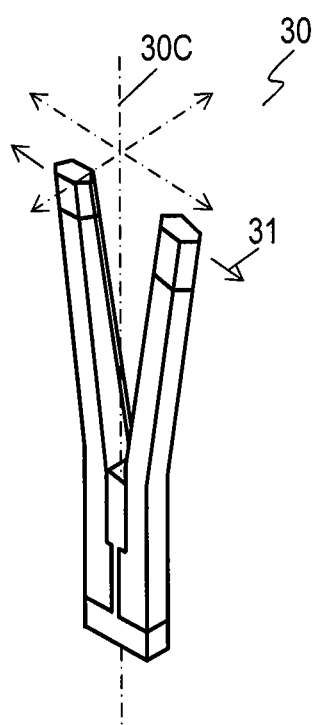
FIG. 3A is a perspective view of an oscillator of the oscillator circuit in accordance with Embodiment 1.
Figure 3B:
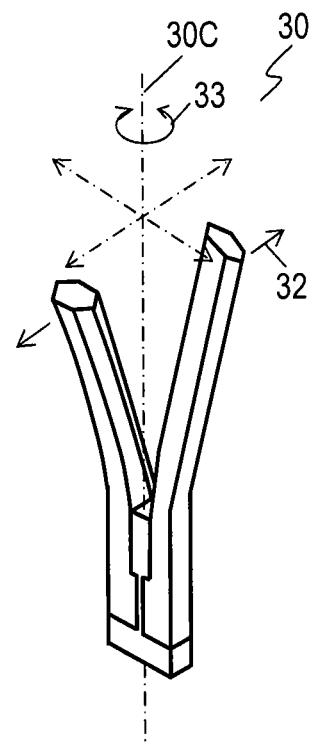
FIG. 3B is a perspective view of the oscillator shown in FIG. 3A.

FIGS. 3A and 3B are perspective views of tuning folk vibrator 30 used as oscillator 11. An operation of inertial sensor 20 including tuning folk vibrator 30 will be described below. FIG. 3A shows driving vibration 31 of tuning folk vibrator 30 driven by driving signal S2, while FIG. 3B shows sensing vibration 32 of tuning folk vibrator 30 caused by angular velocity 33. Receiving driving signal S2 from driver 13, tuning folk vibrator 30 vibrates in the driving vibration mode, performing driving vibration 31 in a radial direction about axis 30C at the driving vibration frequency, i.e., at the natural resonance frequency of the driving vibration mode. When tuning folk vibrator 30 receives angular velocity 33 about axis 30C while performing driving vibration 31, a Coriolis force is produced to cause tuning folk vibrator 30 to perform sensing vibration 32 in a direction perpendicular to both of the direction of driving vibration 31 and axis 30C of angular velocity 33. Tuning folk vibrator 30 outputs a sensing signal according to sensing vibration 32. The sensing signal has a frequency identical to that of driving vibration 31 and has an amplitude that corresponds to angular velocity 33. Detector circuit 21 synchronously detects sensing signal S3 with using monitoring signal S1, and thus, detects angular velocity 33.

Generally, tuning folk vibrator 30 is made of crystal, but may be made of micro-fabricated silicon material to reduce its size. In this case, however, poor accuracy in processing micro-fabricated silicon material may cause variations in the shape of tuning folk vibrator 30. The variation cause variations in the driving vibration frequency of the driving vibration mode to be larger than that of a tuning folk vibrator made of crystal. In this case, when oscillator circuit 10 is optimized to a specific driving vibration frequency, driver 13 cannot drive properly tuning folk vibrator 30 made of the micro-fabricated silicon material.

Figure 4A:
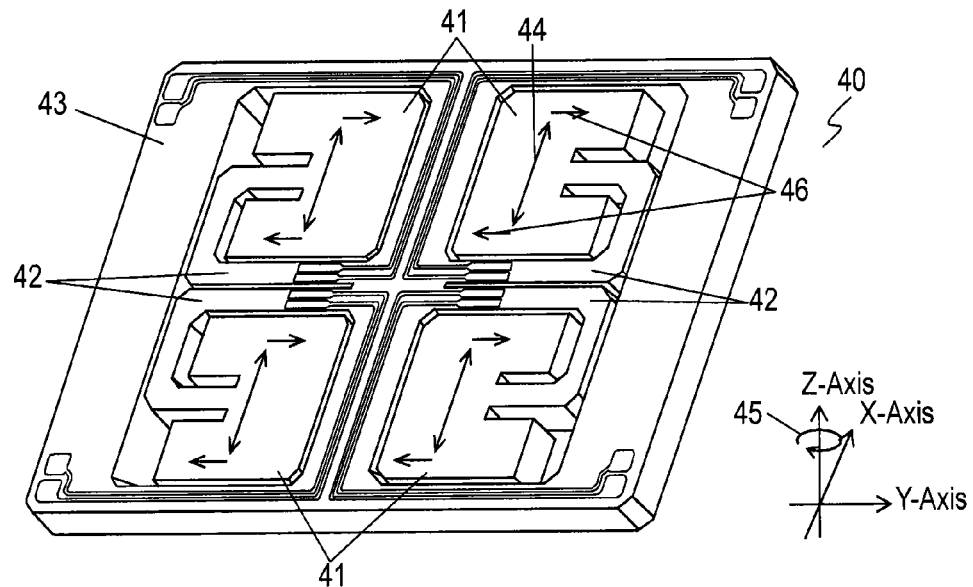
FIG. 4A is a perspective view of another oscillator of the oscillator circuit in accordance with Embodiment 1.
Figure 4B:
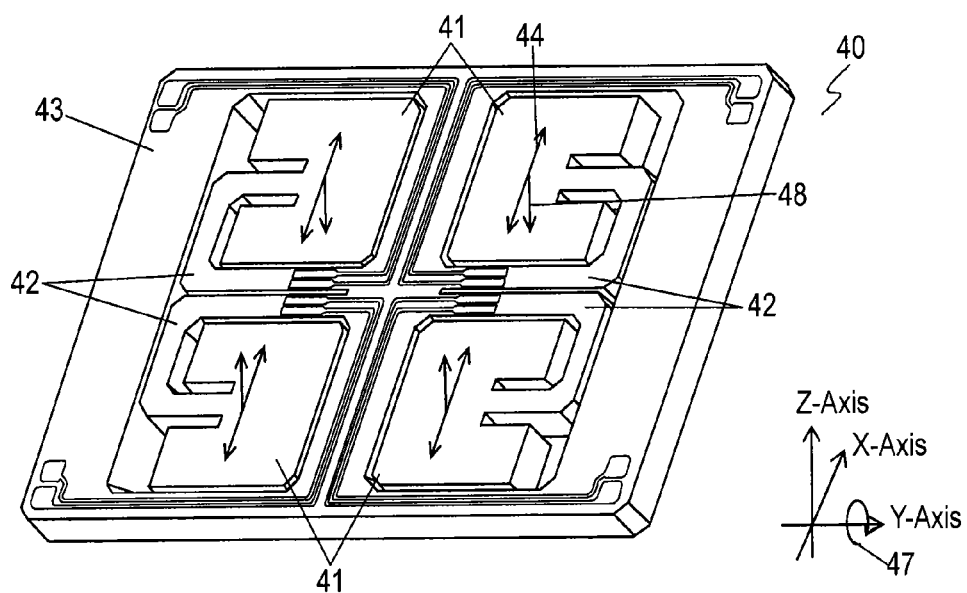
FIG. 4B is a perspective view of the oscillator shown in FIG. 4A.

FIGS. 4A and 4B are perspective views of multi-axis detection oscillator 40 used as oscillator 11. Oscillator 40 has four weights 41, supporter 43, and four flexible arms 42 that connect weights 41 to supporter 43, respectively. An operation of inertial sensor 20 shown in FIG. 2 including oscillator 40 as oscillator 11 will be described below. Upon a driving vibration in a direction of an X-axis being applied to, multi-direction detection oscillator 40 can detect angular velocity 47 about a Y-axis and angular velocity 45 about a Z-axis. The Y-axis and Z-axis are perpendicular to each other and perpendicular to the X-axis.

FIG. 4A shows an operation of multi-axis detection oscillator 40 when detecting angular velocity 45 about the Z-axis. When driver 13 of oscillator circuit 10 applies driving signal S2 to multi-axis detection oscillator 40, weights 41 vibrate in the driving vibration mode in the direction of the X-axis, and allows oscillator 40 to perform driving vibration 44 at a natural resonance frequency of the driving vibration mode. When oscillator 40 receives angular velocity 45 about the Z-axis while performing driving vibration 44, a Coriolis force is produced to generate sensing vibration 46 in a direction of the Y-axis, thereby causing weights 41 to vibrate in the direction of the Y-axis. Performing sensing vibration 46, oscillator 40 outputs sensing signal S3. Sensing signal S3 has a frequency identical to that of driving vibration 44 and has an amplitude that corresponds to angular velocity 45. Detector circuit 21 synchronously detects sensing signal S3 with using monitoring signal S1 and detects angular velocity 45.

FIG. 4B shows an operation of multi-axis detection oscillator 40 when detecting angular velocity 47 about the Y-axis. When oscillator 40 receives angular velocity 47 about the Y-axis while performing driving vibration 44, a Coriolis force is produced and generates sensing vibration 48 in a direction of the Z-axis, thereby causing weights 41 to vibrate in a direction of the Z-axis. Performing sensing vibration 48, oscillator 40 outputs a sensing signal. The sensing signal has a frequency identical to that of driving vibration 44 and has an amplitude that corresponds to angular velocity 47. Detector circuit 21 synchronously detects the sensing signal with using monitoring signal S1, and thus, detects angular velocity 47.

In order to detect angular velocities 45 and 47 accurately, multi-axis detection oscillator 40 has a complicatedly shape having four weights 41, four arms 42, and supporter 43. Oscillator 40 can be processed less accurately than tuning folk vibrator 30 shown in FIG. 3, hence increasing variations in the driving vibration frequency. If oscillator circuit 10 is optimized to a specific driving vibration frequency, driver 13 cannot drive properly multi-axis detection oscillator 40 having such complicated shape.

In tuning-folk vibrator 30 and multi-axis detection oscillator 40, conversion from driving signal S2 into driving vibration 31, 44 and conversion from sensing vibration 32, 46, 48 into sensing signal S3 is implemented by a piezoelectric method, a capacitance method, or an electromagnetic drive method.

If oscillator 11 has considerable variations in the driving vibration frequency, oscillator circuit 10 cannot drive oscillator 11 properly, hence degrading stability of oscillation of oscillator 11. This reduces a gain margin and a phase margin for oscillation of oscillator 11, degrading resistance to change in the driving vibration frequency caused by changes in temperature and voltage of power supply. The changes in external environment may stop the vibration of oscillator 11.

In oscillator circuit 10 according to Embodiment 1, frequency measuring section 14A detects the driving vibration frequency by detecting the frequency of monitoring signal S1 output from oscillator 11. Based on the detected driving vibration frequency, controller 14 properly determines the passing characteristic of filter 12. This operation allows driver 13 to properly drive oscillator 11 stably even if oscillator 11 has variations in processing accuracy.

As described above, sensing signal S3 has a frequency identical to that of the driving vibration frequency. Detector circuit 21 can detect an angular velocity applied to oscillator 11 even if the driving vibration frequency varies from a predetermined value. In oscillator circuit 10, the driving vibration frequency may not necessarily be adjusted accurately to a predetermined value previously. Oscillator circuit 10 flexibly determines the passing characteristic of filter 12 based on the driving vibration frequency, and oscillates stably, thus enhancing stability of oscillation of inertial sensor 20.

Figure 25:
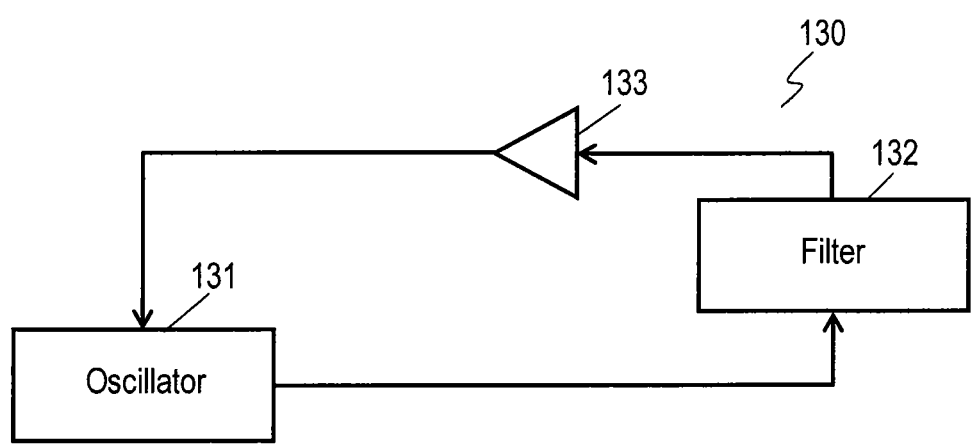
FIG. 25 is a circuit block diagram of a conventional oscillator circuit.

In conventional oscillator circuit 130 shown in FIG. 25, the passing characteristic of filter 132 is fixed. Therefore, filter 132, due to the fixed passing characteristic with no flexibility, cannot be optimized to variations in the driving vibration frequency caused by variations in processing accuracy of oscillator 131, and to changes in the driving vibration frequency caused by ambient temperature and aging degradation.

Figure 5A:
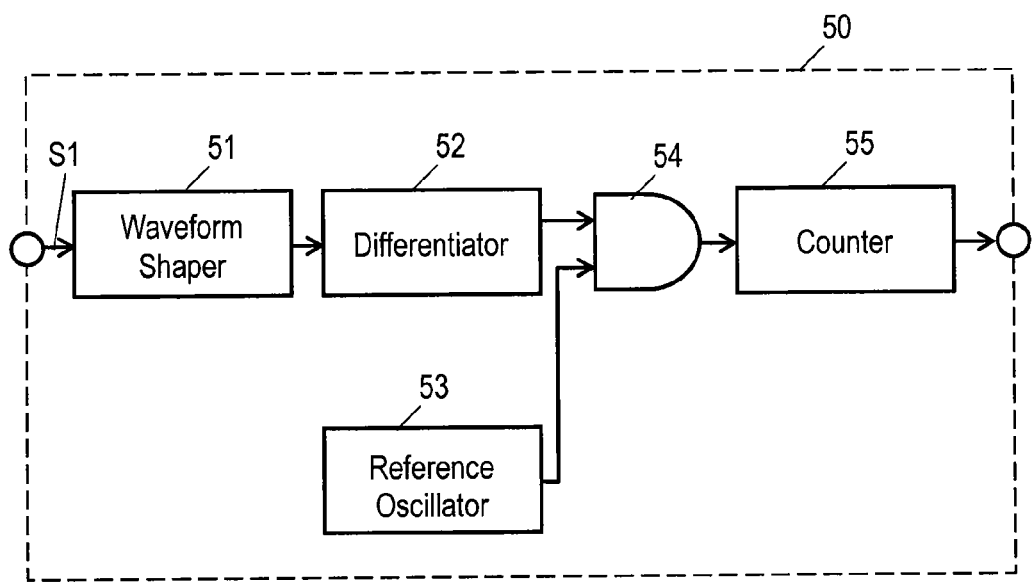
FIG. 5A is a circuit block diagram of a frequency measuring section of the oscillator circuit in accordance with Embodiment 1.

FIG. 5A is a circuit block diagram of frequency measuring section 50, frequency measuring section 14A for detecting the frequency of monitoring signal S1. Monitoring signal S1 is a sine wave having the driving vibration frequency. Frequency measuring section 50 includes a waveform shaper 51, a differentiator 52, a reference oscillator 53, an AND gate 54, and a counter 55. Waveform shaper 51 changes the sine wave of monitoring signal S1 into a rectangular wave. Differentiator 52 differentiates the rectangular wave to convert the rectangular wave into monitoring pulse signals. Reference oscillator 53 outputs a reference signal. Receiving the monitoring pulse signals and the reference signal, AND gate 54 outputs pulse signals. Counter 55 counts the number of the pulse signals output from AND gate 54. The reference signal has a high level and a low level switched alternately at a predetermined duty ratio. AND gate 54 outputs a logical conjunction of the monitoring pulse signals and the reference signal. That is, AND gate 54 outputs the monitoring pulse signals only within a gate period in which reference signal is at the high level. AND gate 54 does not output the monitoring pulse signals while the reference signal is at the low level. Frequency measuring section 50 detects the frequency of received monitoring signal S1 by counting the number of the monitoring pulse signals during the gate period.

Frequency measuring section 50 is just an example of frequency measuring section 14A and is not to be construed as a limiting structure. For example, frequency measuring section 14A may output a voltage corresponding to difference in frequencies of monitoring signal S1 and the reference signal. Alternately, frequency measuring section 14A may analog/digital-converts monitoring signal S1 into a digital signal, and performs a fast Fourier conversion to the digital signal to analyze the frequency.

Reference oscillator 53 may have a Q factor larger than that of oscillator circuit 10, the frequency of monitoring signal S1 can be detected more accurately. For example, reference oscillator 53 may include an oscillator including a crystal oscillator or a ceramic resonator which has a Q factor larger than that of oscillator circuit 10.

Figure 5B:
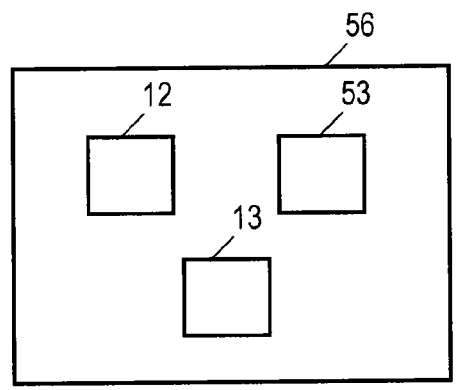
FIG. 5B is schematic view of a chip used for the oscillator circuit in accordance with Embodiment 1.

FIG. 5B is a schematic view of chip 56 used for oscillator circuit 10. In the case that oscillator 11 is made of micro-fabricated silicon material, reference frequency oscillator 53 may be implemented by a small and inexpensive oscillator, such as a CR oscillator including capacitors and resistors, a silicon oscillator made of silicon material, or and a ring oscillator including NOT gates and NOR gates connected in a ring shape. This arrangement allows reference oscillator 53 to be incorporated with filter 52 and driver 53 into chip 56.

Reference oscillator 53 may be implemented by an oscillator having variations of production smaller than that of oscillator circuit 10. This arrangement reduces variations of the gate period and suppresses variations in the measurement of the frequency. For example, an oscillator including a crystal oscillator or a ceramic resonator has variation of production smaller than that of oscillator circuit 10. In the case that oscillator 11 is made of micro-fabricated silicon material, reference oscillator 53 may be implemented by a small, inexpensive oscillator, such as a CR oscillator including capacitors and resistors, a silicon oscillator made of silicon material, or a ring oscillator including NOT gates and NOR gates connected in a ring shape. Such oscillators allow reference oscillator 53 to be incorporated with filter 12 and driver 13 into the same chip.

Reference oscillator 53 may be implemented by an oscillator having a frequency-temperature coefficient smaller than that of oscillator circuit 10. This arrangement reduces the change of the gate period due to the change of an ambient temperature, thus stabilize the gate period to measure the frequency accurately. For example, an oscillator including a crystal oscillator or a ceramic resonator has variations of production smaller than those of oscillator circuit 10. In the case that oscillator 11 is made of micro-fabricated silicon material, reference oscillator 53 may be implemented by a small, inexpensive oscillator, such as a CR oscillator including capacitors and resistors, a silicon oscillator made of silicon material, or a ring oscillator having NOT gates and NOR gates connected in a ring shape. Such oscillators allow reference oscillator 53 to be incorporated with filter 12 and driver 13 into the same chip.

Figure 6:
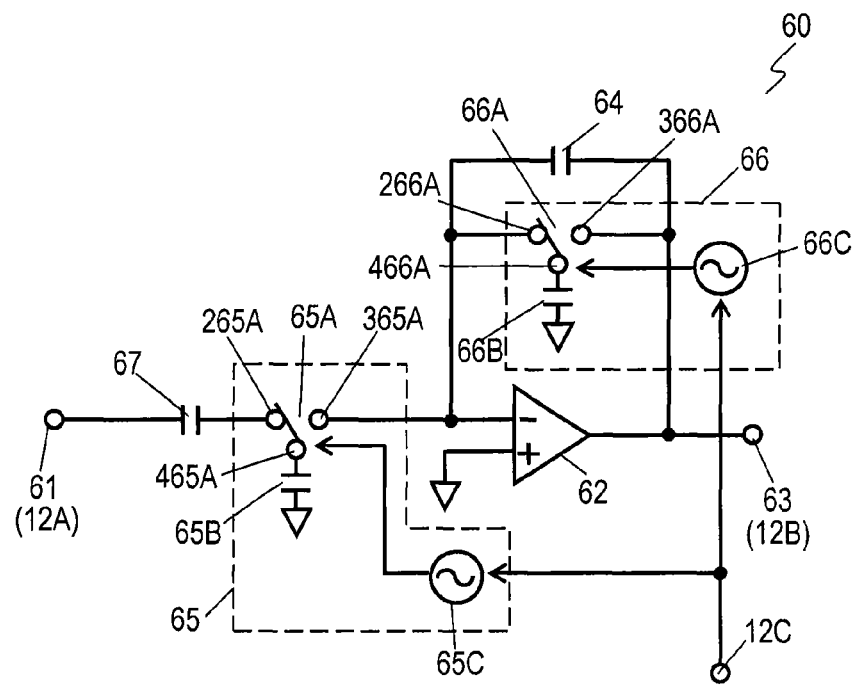
FIG. 6 is a circuit diagram of a bandpass filter of the oscillator circuit in accordance with Embodiment 1.

FIG. 6 is a circuit diagram of bandpass filter 60, filter 12. Bandpass filter 60 includes input terminal 61, operational amplifier 62, switched capacitor 65, capacitor 67, output terminal 63, capacitor 64, and switched capacitor 66. Input terminal 61 corresponds to input port 12A of filter 12 receives monitoring signal S1. Output terminal 63 corresponds to output port 12B. Switched capacitor 65 is connected to an inverting input port of operational amplifier 62. Capacitor 67 is connected between input terminal 61 and switched capacitor 65. Capacitor 64 is connected between the output terminal and the inverting input port of operational amplifier 62. Switched capacitor 66 is connected in parallel to capacitor 64. A non-inverting input port of operational amplifier 62 is grounded.

Switched capacitor 65 includes switch 65A, capacitor 65B connected between switch 65A and the ground, and variable clock generator 65C generating clock signal CK65 for switching switch 65A. Switch 65A has branch end 265A connected to capacitor 67, branch end 365A connected to the inverting input port of operational amplifier 62, and common end 465A connected to capacitor 65B. In switch 65A, common end 465A is connected alternately and selectively with branch end 265A and branch end 365A at a period of clock signal CK65, and functions as a resistor connected between branch ends 265A and 365A. The frequency of clock signal CK65 is adjusted based on the control signal received from control terminal 12C so as to adjust a resistance of switched capacitor 65 functioning as a resistor.

Similarly, switched capacitor 66 includes switch 66A, capacitor 66B connected between switch 66A and the ground, and variable clock generator 66C generating clock signal CK66 for switching switch 66A. Switch 66A has branch end 366A, branch end 266A, and common end 466A. Branch end 366A is connected to an output port of operational amplifier 62, while branch end 266A is connected to an inverting input port of operational amplifier 62. Common end 466A is connected to capacitor 66B. In switch 66A, common end 466A is connects selectively and alternately with branch end 266A and branch end 366A at a period of clock signal CK66, and functions as a resistor connected between branch ends 266A and 366A. The frequency of clock signal CK66 is adjusted based on the control signal received from control terminal 12C so as to adjust a resistance of switched capacitor 66 functioning as a resistor.

Frequencies of clock signals CK65 and CK66 are controlled while the ratio of the frequencies is maintained constant. This operation can adjust the center frequency of bandpass filter 60, thus constituting filter 12 having a simple structure.

Figure 7:
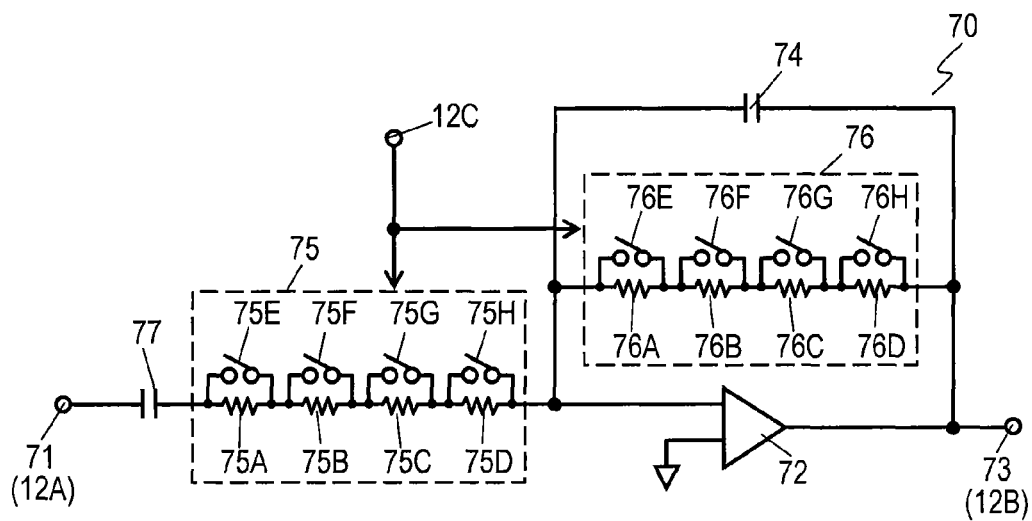
FIG. 7 is a circuit diagram of another bandpass filter of the oscillator circuit in accordance with Embodiment 1.

FIG. 7 is a circuit diagram of bandpass filter 70, another filter 12. Bandpass filter 70 has input terminal 71, operational amplifier 72, variable resistor 75, capacitor 77, output terminal 73, capacitor 74, and variable resistor 76. Input terminal 71 corresponds to input port 12A of filter 12 and receives monitoring signal S1. Output terminal 73 corresponds to output port 12B. Variable resistor 75 is connected to an inverting input port of operational amplifier 72. Capacitor 77 is connected between input terminal 71 and variable resistor 75. Capacitor 74 is connected between the output terminal and the inverting input port of operational amplifier 72. Variable resistor 76 is connected in parallel to capacitor 74. A non-inverting input port of operational amplifier 72 is grounded.

Variable resistor 75 includes resistors 75A, 75B, 75C, and 75D connected in series and switches 75E, 75F, 75G, and 75H which bypass resistors 75A, 75B, 75C, and 75D, respectively. Similarly, variable resistor 76 includes resistors 76A, 76B, 76C, and 76D connected in series and switches 76E, 76F, 76G, and 76H which bypass resistors 76A, 76B, 76C, and 76D, respectively.

The resistance of variable resistor 75 is controlled by controlling the switches. For example, when all of the switches 75E to 75H are turned off, the resistance of variable resistor 75 is the total of the resistances of resistors 75A to 75D. When only switch 75E is turned on and switches 75F, 75G, and 75H are turned off, the resistance of variable resistor 75 is the total of the resistances of resistors 75B, 75C, and 75D. That is, four switches 75E to 75H are controlled to adjust the resistance of variable resistor 75 to 16 (=$2^4$) levels. Similarly, four switches 76E to 76H are controlled to adjust the resistance of variable resistor 76 to 16 levels. In general, if variable resistor 75 (76) includes the number N of resistors connected in series and the number N of switches bypassing the resistors, the resistance of variable resistor 75 (76) can be adjusted to $2^N$ levels.

The resistances of variable resistors 75 and 76 are adjusted while the ratio of the resistances is maintained constant, thereby adjusting the center frequency of bandpass filter 70. That is, only the control of the switches adjusts the center frequency to plural levels without generating a clock signal for bandpass filter 70.

Filter 12 is not necessarily a bandpass filter. If there is no undesired frequency lower than the driving vibration frequency of oscillator 11, filter 12 may be a low-pass filter. If there is no undesired frequency higher than the driving vibration frequency of oscillator 11, filter 12 may be a high-pass filter.

In controller 14 of oscillator circuit 10, as described above, frequency measuring section 14A measures the frequency of monitoring signal S1, and adjuster 14B properly determines the frequency characteristic of filter 12 based on the measured frequency.

Figure 8A:
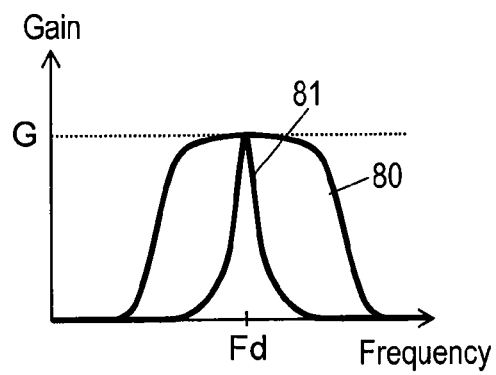
FIG. 8A shows a frequency characteristic of the bandpass filter in accordance with Embodiment 1.
Figure 8B:
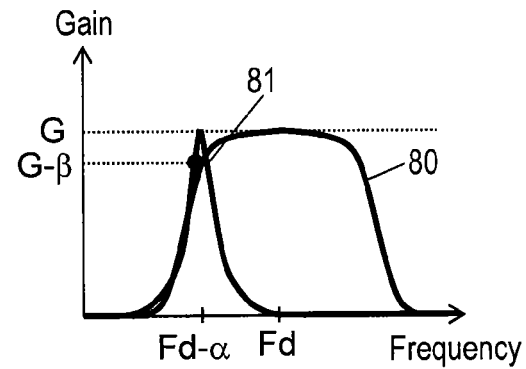
FIG. 8B shows a frequency characteristic of the bandpass filter in accordance with Embodiment 1.
Figure 8C:
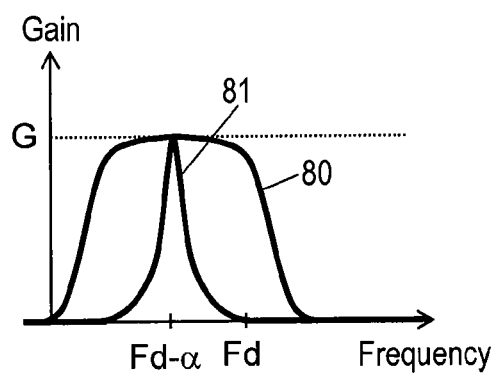
FIG. 8C shows a frequency characteristic of the bandpass filter in accordance with Embodiment 1.

FIGS. 8A to 8C show frequency characteristics of filter 12. As shown in FIG. 8A, when driving vibration frequency Fd of oscillator 11 is about the center frequency of passing frequency band 80 of filter 12, filter 12 has maximum gain G to driving vibration frequency Fd and has the frequency characteristic optimized, hence allowing oscillator 11 to oscillate stably.

As shown in FIG. 8B, the driving vibration frequency of oscillator 11 is lower than frequency Fd shown in FIG. 8A by difference α caused by, for example, variations in processing accuracy. In the case, frequency (Fd−α) is located at the lower end of the passing frequency band of filter 12, hence attenuating monitoring signal S1 input to filter 12. Filter 12 has gain (G−β) which is smaller than gain G to driving vibration frequency Fd. This decreases a gain margin of oscillator circuit 10, and degrades oscillating stability of oscillator 11 or stops the oscillation.

Frequency measuring section 14A of controller 14 measures the frequency of monitoring signal S1 to find driving vibration frequency (Fd−α). Adjuster 14B supplies a control signal to control terminal 12C of filter 12, as shown in FIG. 8C, so that the center frequency of filter 12 is shifted to frequency (Fd−α). This operation allows filter 12 to have large gain G to driving vibration frequency (Fd−α), enhancing the oscillating stability of oscillator circuit 10. The center frequency of filter 12 is not necessarily exactly the frequency of monitoring signal S1. The oscillating stability of oscillator 11 can be obtained by adjusting the frequency characteristic of the bandpass filter such that the attenuation of monitoring signal S1 becomes sufficiently small.

Figure 9:
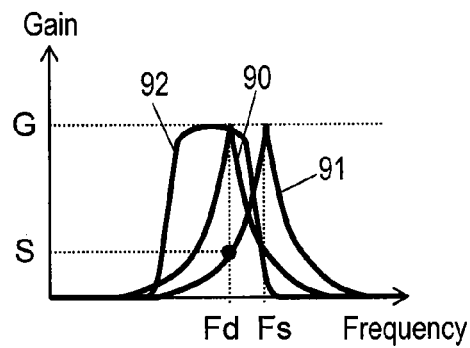
FIG. 9 shows a frequency characteristic of the bandpass filter in accordance with Embodiment 1.

FIG. 9 shows a frequency characteristic of filter 12. In inertial sensor 20 as an angular velocity sensor shown in FIG. 2, oscillator 11 is driven by driver 13 and performs a driving vibration at frequency Fd. Further, when oscillator 11 receives an angular velocity from outside while performing the driving vibration, a Coriolis force is produced to generate a sensing vibration at frequency Fs in a direction perpendicular to the direction of the driving vibration and to the axis of the angular velocity. Frequency Fs is higher than frequency Fd shown in FIG. 9. Frequency Fs may be lower than frequency Fd according to the structure of oscillator 11. The sensing vibration is necessary for detecting the angular velocity, however, is an undesired vibration for oscillator circuit 10 to allow oscillator 11 to oscillate stably. Since monitoring signal S1 contains a component of frequency Fs of the sensing vibration, filter 12 suppresses the component.

In addition to the frequency of monitoring signal S1, frequency measuring section 14A may detect frequency Fs of sensing signal S3 generated by the sensing vibration as well. If frequency Fs of the sensing vibration is higher than frequency Fd of monitoring signal S1 measured by frequency measuring section 14A, the center frequency of filter 12, the bandpass filter is adjusted to be lower than frequency Fd. If frequency Fs is lower than frequency Fd, the center frequency of filter 12 is adjusted to be higher than frequency Fd. This adjustment sufficiently suppresses the component of frequency Fs contained in monitoring signal S1.

According to Embodiment 1, oscillator circuit 10 suppresses variations in the driving vibration frequency of oscillator 11 caused by variations in processing accuracy. In addition to above, oscillator circuit 10 oscillates even when the driving vibration frequency changes due to a change in an ambient temperature and deterioration with age of oscillator 11. That is, even when oscillator 11 has variations in the driving vibration frequency, oscillator circuit 10 detects the frequency of monitoring signal S1 and optimizes the frequency characteristic of filter 12 based on the detected frequency.

Frequency measuring section 14A may not be used for variations in the driving vibration frequency caused by changes in ambient temperature. Alternatively, a temperature sensor disposed close to oscillator 11 detects a temperature. The driving vibration frequency of oscillator 11 may be obtained by a conversion table previously prepared or by a calculation using the frequency characteristic of oscillator 11. Adjuster 14B can adjust filter 12 to have an optimum frequency characteristic based on the calculated frequency.

Exemplary Embodiment 2

Figure 10:
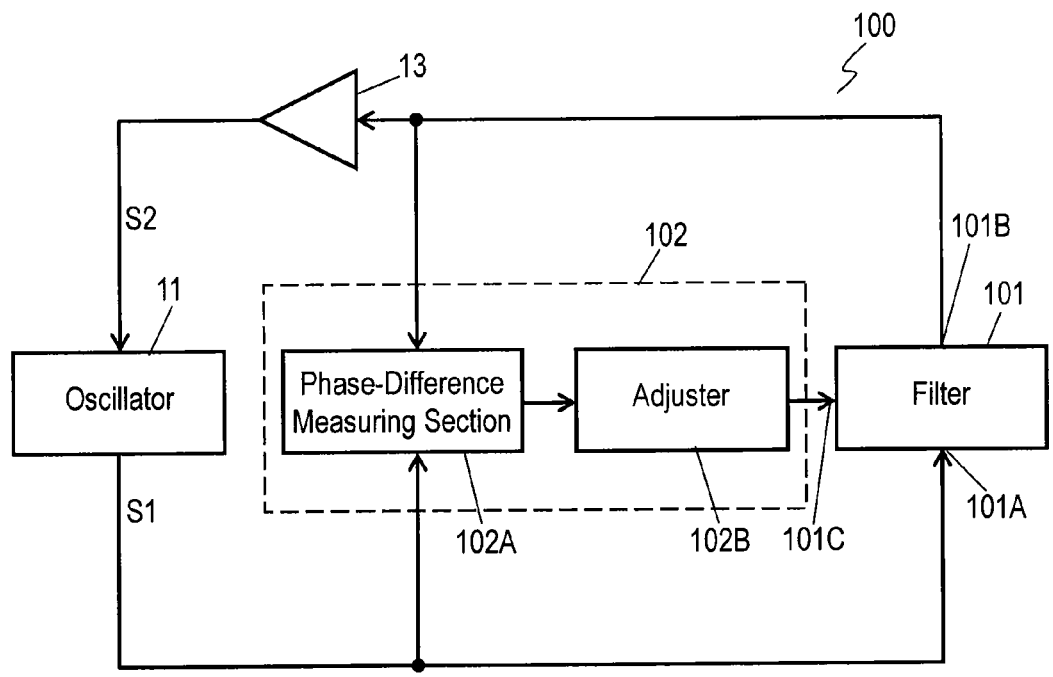
FIG. 10 is a circuit block diagram of an oscillator circuit in accordance with Exemplary Embodiment 2 of the invention.

FIG. 10 is a block diagram of oscillator circuit 100 in accordance with Exemplary Embodiment 2. In FIG. 10, components identical to those of oscillator circuit 10 shown in FIG. 1 are denoted by the same reference numerals. Oscillator circuit 100 shown in FIG. 10 includes filter 101 and controller 102 instead of filter 12 and controller 14 of oscillator circuit 10 shown in FIG. 1. That is, oscillator circuit 100 includes oscillator 11, filter 101, driver 13, and controller 102. Filter 101 receives monitoring signal S1 output from oscillator 11. Driver 13 supplies driving signal S2 to oscillator 11. Controller 102 controls a passing characteristic of filter 101 based on monitoring signal S1. Driven by driving signal S2 output from driver 13, oscillator 11 vibrates at a driving vibration frequency. Oscillator 11 outputs monitoring signal S1 according to the vibration. Monitoring signal S1 has a frequency identical to the driving vibration frequency. Filter 101 filters monitoring signal S1 input to input port 101A, and outputs the filtered signal from output port 101B. The passing characteristic of filter 101 is controlled by a control signal input to control port 101C. Driver 13 amplifies the filtered signal to generate driving signal S2. Controller 102 includes phase-difference measuring section 102A and adjuster 102B. Phase-difference measuring section 102A detects a phase difference between monitoring signal S1 input to filter 101 and the filtered signal output from filter 101. Adjuster 102B adjusts a phase characteristic of filter 101 so that the detected phase difference becomes a predetermined value.

Tuning folk vibrator 30 shown in FIGS. 3A and 3B and multi-axis detection oscillator 40 shown in FIGS. 4A and 4B are employed as oscillator 11. As described above, these oscillators have variations in the driving vibration frequency sue to variations in processing accuracy, and changes in ambient temperature and deterioration with age cause a change in the driving vibration frequency. Such variations or change in the driving vibration frequency cause variations or changes in the amount of a phase shift of monitoring signal S1 passing through filter 10. This reduces a phase margin of oscillator circuit 100, and degrades oscillating stability of oscillator 11 or stops the oscillation.

Adjuster 102B of controller 102 adjusts a phase characteristic of filter 101 so that the phase difference between monitoring signal S1 input to filter 101 and the filtered signal output from filter 101 is equal to a predetermined value. This arrangement allows filter 101 allows an amount of phase rotation to be maintained at a predetermined value.

Phase-difference measuring section 102A may be implemented by flip-flops that are often used for a phase comparator in a phase locked loop (PLL) circuit.

Figure 11A:
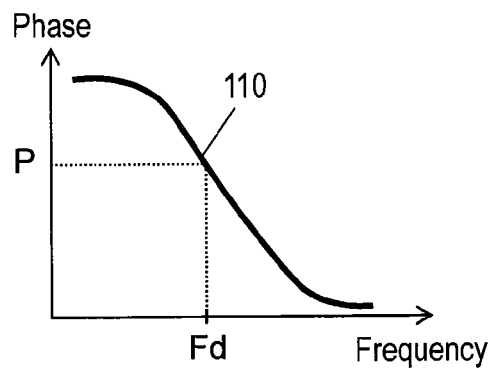
FIG. 11A shows a phase characteristic of a filter of the oscillator circuit in accordance with Embodiment 2.
Figure 11B:
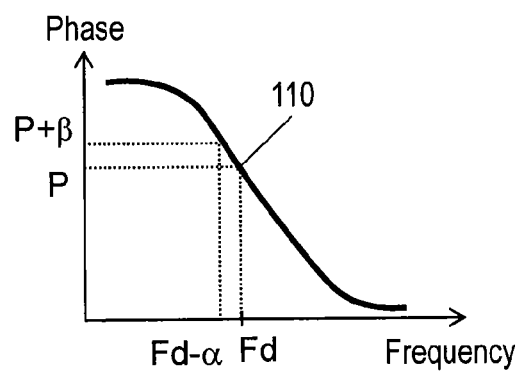
FIG. 11B shows a phase characteristic of the filter in accordance with Embodiment 2.
Figure 11C:
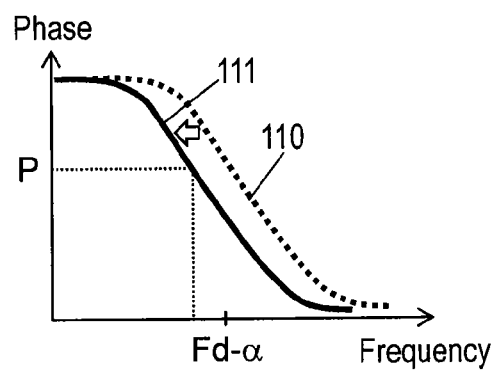
FIG. 11C shows a phase characteristic of the filter in accordance with Embodiment 2.

FIGS. 11A to 11C show the phase characteristic of filter 101.

In phase characteristic 110 of filter 101 shown in FIG. 11A, the predetermined value P is an amount of phase shift by which a signal having driving vibration frequency Fd of oscillator 11 passes through filter 101. This value allows oscillator 11 to oscillate stably, and thus, allows oscillator circuit 110 oscillates stably.

As shown in FIG. 11B, in the case that the driving vibration frequency of oscillator 11 is lowered from frequency Fd shown in FIG. 11A to frequency (Fd−α) by difference α due to variations in, for example, processing accuracy, the amount of phase shift increases by difference β due to characteristic 110 of filter 101, thus becoming an amount (P+β) of phase rotation. This decreases a phase margin of oscillator circuit 100, and degrades oscillating stability or stops the oscillation.

To address the problem, phase-difference measuring section 102A of controller 102 measures the phase difference between monitoring signal S1 and the filtered signal. Adjuster 102B adjusts the phase characteristic of filter 101 so that the measured phase difference is equal to predetermined value P. That is, adjuster 102B adjusts the phase characteristic of filter 101 so as to change from phase characteristic 110 to phase characteristic 111. This operation adjusts the amount of phase shift at driving vibration frequency (Fd−α) to predetermined value P, thereby allowing oscillator circuit 100 to oscillating stably.

Exemplary Embodiment 3

Figure 12:
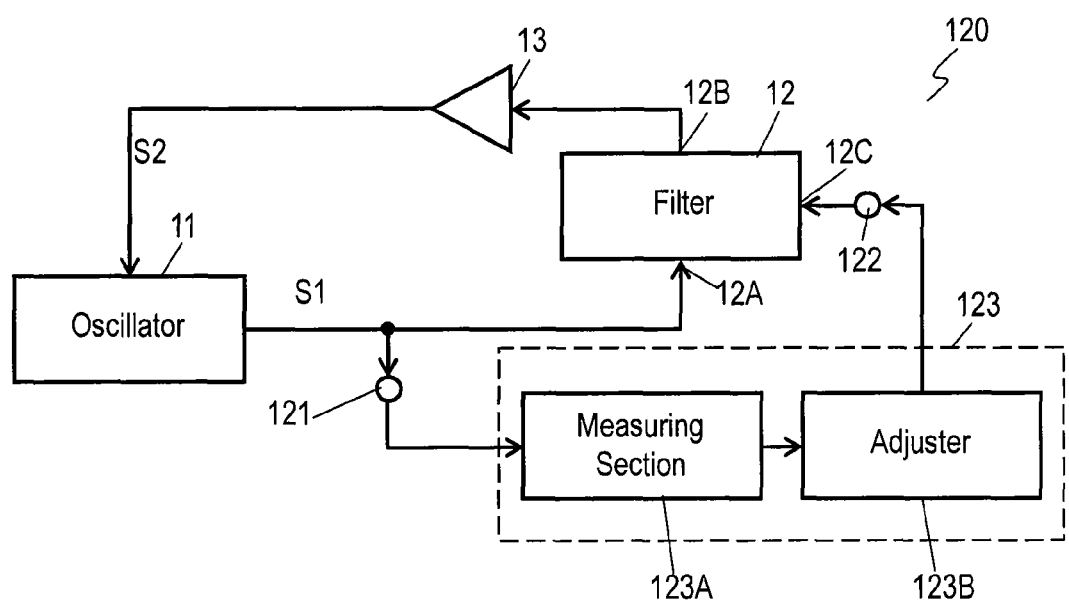
FIG. 12 is a circuit block diagram of an oscillator circuit in accordance with Exemplary Embodiment 3 of the invention.

FIG. 12 is a block diagram of oscillator circuit 120 in accordance with Exemplary Embodiment 3. In FIG. 12, components identical to those of oscillator circuit 10 shown in FIG. 1 are denoted by the same reference numerals. Oscillator circuit 120 includes oscillator 11, filter 12, driver 13, monitoring terminal 121, and adjusting terminal 122. Filter 12 receives monitoring signal S1 output from oscillator 11. Driver 13 supplies oscillator 11 with driving signal S2. Monitoring terminal 121 outputs monitoring signal S1. Adjusting terminal 122 receives a control signal for adjusting the passing characteristic of filter 12. Monitoring signal S1 is output from oscillator 11 according to its vibration, and has a frequency identical to the driving vibration frequency. Filter 12 filters monitoring signal S1 input to input port 12A to output a filtered signal from output port 12B. The passing characteristic of filter 12 are controlled by a control signal supplied from adjusting terminal 122 and received at control terminal 12C. Driver 13 amplifies the filtered signal to generate driving signal S2.

Controller 123 includes measuring section 123A and adjuster 123B. Measuring section 123A detects the characteristic of monitoring signal S1 output from monitoring terminal 121. Based on the detected characteristic, adjuster 123B supplies a control signal to adjusting terminal 122. The control signal output from adjuster 123B may control filter 12 in a frequency characteristics of an amplitude, a frequency characteristic of a phase, of the frequency characteristics of both the amplitude and phase.

Oscillator circuit 120 is manufactured, and then, controller 123 is connected to monitoring terminal 121 and adjusting terminal 122. Controller 123 adjusts the passing characteristic of filter 12 optimally to variations in the driving vibration frequency caused by variations in processing accuracy of oscillator 11. After that, controller 123 stores the adjusted characteristic in filter 12. Controller 123 is then removed from monitoring terminal 121 and adjusting terminal 122. These processes provide small oscillator circuit 120 having the optimal passing characteristic even if the driving vibration frequency has variations due to variations in processing accuracy of oscillator 11. The optimum adjustment of passing characteristic may be carried out after the oscillator circuit is completed. After oscillator circuit 120 is manufactured, controller 123 is connected to monitoring terminal 121 and adjusting terminal 122 to adjust the passing characteristic of filter 12, and then, is removed. This operation provides oscillator circuit 120 oscillating stably even if having aging changes or environmental changes.

For example, measuring section 123A may be frequency measuring section 50 shown in FIG. 5A so as to measure the frequency of monitoring signal S1. Filter 12 may be, for example, bandpass filter 60 shown in FIG. 6 or bandpass filter 70 shown in FIG. 7 so as to adjust the frequency characteristic. Adjuster 123B supplies the control signal adjusting the frequency characteristic to adjusting terminal 122, and optimizes the passing characteristic of filter 12.

The oscillator circuit is used in an angular velocity sensor according to Embodiments 1 to 3. The structure of the oscillator circuit and the method of manufacturing the oscillator circuit may be applicable to sensors, such as acceleration sensors or gas sensor, for measuring physical quantity with the oscillator circuit, and also applicable to actuators, such as a driving device for driving a micro-electromechanical system (MEMS) mirror in an image projector, for converting an electrical signal into a mechanical operation. The oscillator circuit allows the oscillator to oscillate stably, and is suitable for sensors and actuators, such as a digital camera and a car navigation system, used for electronic devices.

Exemplary Embodiment 4

Figure 13:
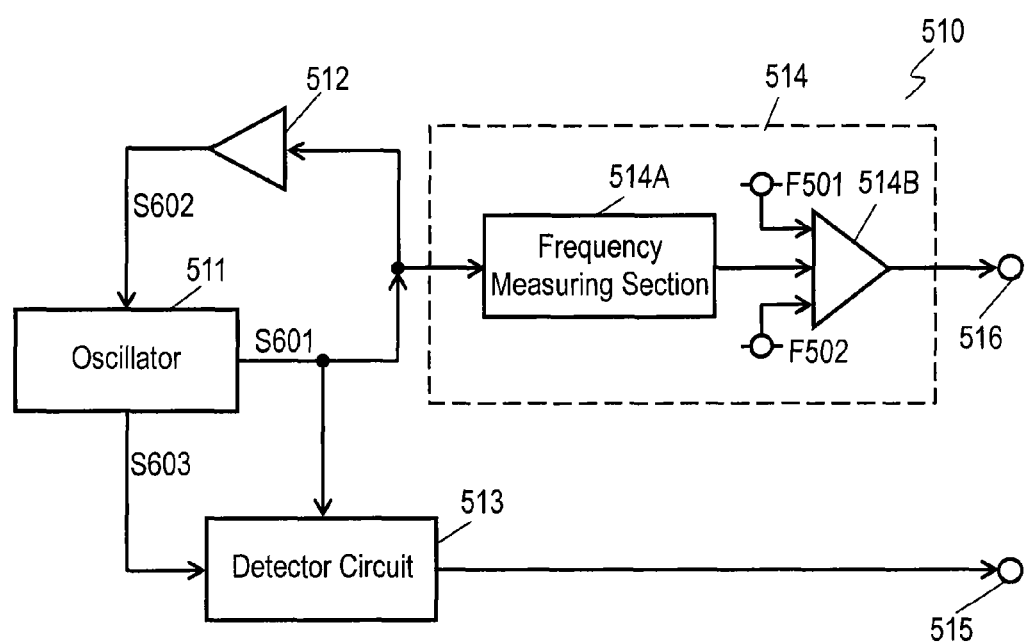
FIG. 13 is a circuit block diagram of an inertial sensor in accordance with Exemplary Embodiment 4 of the invention.

FIG. 13 is a circuit block diagram of inertial sensor 510 in accordance with Exemplary Embodiment 4. Inertial sensor 510 includes oscillator 511, driver 512, detector circuit 513, and abnormal-state detector 514. Upon being driven by driving signal S602, oscillator 511 vibrates. Driver 512 amplifies monitoring signal S601 output from oscillator 511 to generate and supply driving signal 602 to oscillator 511. Detector circuit 513 detects sensing signal S603 output from oscillator 511. Abnormal-state detector 514 outputs an abnormal-state detection signal based on monitoring signal S601. Oscillator 511 outputs sensing signal S603 according to a movement provided from outside while vibrating. Abnormal-state detector 514 includes frequency measuring section 514A and window comparator 514B. Frequency measuring section 514A measures the frequency of monitoring signal S601. Window comparator 514B outputs an abnormal-state detection signal if the measured frequency is not lower than upper threshold F501 or not higher than lower threshold F502.

Inertial sensor 510 is used, for example, as an angular velocity sensor. In this case, oscillator 511 outputs sensing signal S603 according to an angular velocity applied from outside. Being driven by driving signal S602, oscillator 511 vibrates in a driving vibration mode at a driving vibration frequency, and also vibrates in a sensing vibration mode in which oscillator 511 vibrates by being excited by an amount of inertia, such as an angular velocity, provided from outside.

Figure 14A:
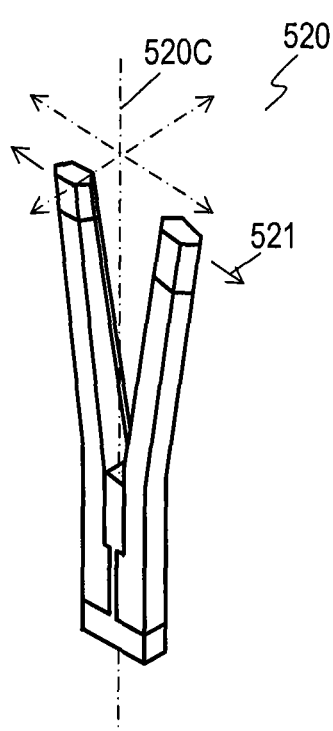
FIG. 14A is a perspective view of an oscillator of the inertial sensor in accordance with Embodiment 4.
Figure 14B:
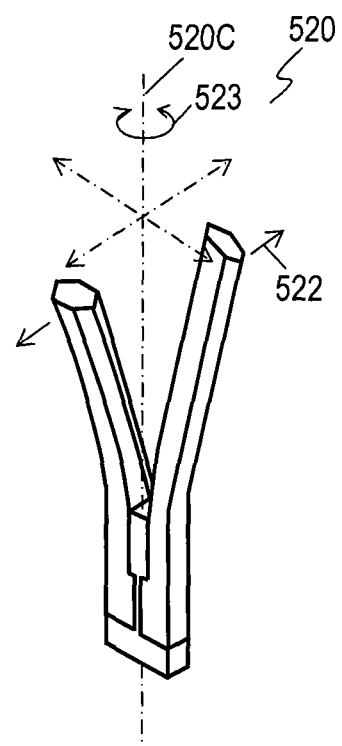
FIG. 14B is a perspective view of the oscillator shown in FIG. 14A.

FIGS. 14A and 14B are perspective views of tuning folk vibrator 520 used as oscillator 511. An operation of inertial sensor 510 including tuning folk vibrator 520 as oscillator 511 will be described below. FIG. 14A shows driving vibration 521 of tuning folk vibrator 520 driven by driving signal S602. FIG. 14B shows sensing vibration 522 of tuning folk vibrator 520 caused by angular velocity 523. Receiving driving signal S602 from driver 512, tuning folk vibrator 520 vibrates in the driving vibration mode, thereby performing driving vibration 521 in a radial direction about axis 520C at a natural resonance frequency of the driving vibration mode. When tuning folk vibrator 520 receives angular velocity 523 about axis 520C while performing driving vibration 521, a Coriolis force is produced to perform sensing vibration 522 in a direction perpendicular to the direction of driving vibration 521 and to axis 520C of angular velocity 523. Performing sensing vibration 522, tuning folk vibrator 520 outputs a sensing signal. The sensing signal has a frequency identical to that of driving vibration 521 and has an amplitude that corresponds to angular velocity 523. Detector circuit 513 synchronously detects sensing signal S603 with using monitoring signal S601, thereby detecting angular velocity 523.

Figure 15:
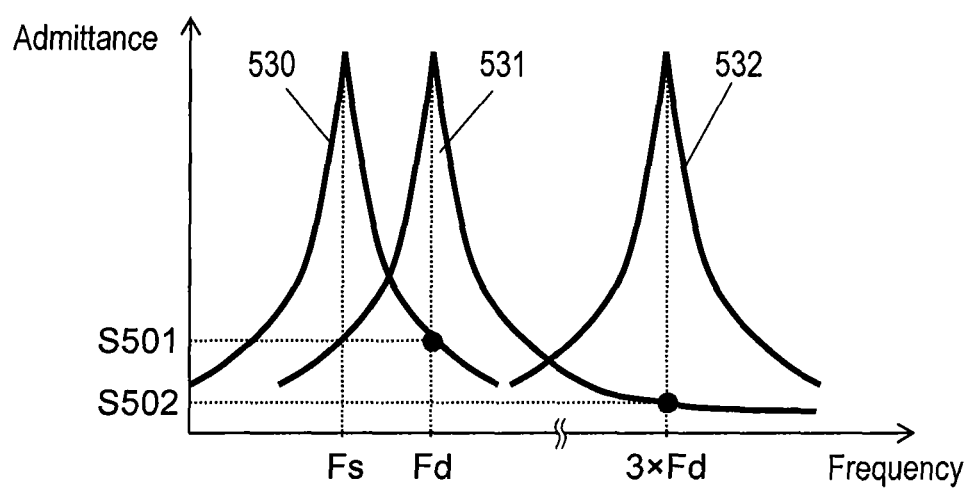
FIG. 15 shows a frequency characteristic of the oscillator in accordance with Embodiment 4.

FIG. 15 shows an admittance characteristic of oscillator 511. The relation between driving vibration 521 and sensing vibration 522 will be described with reference to FIG. 15. In FIG. 5, the horizontal axis represents the frequency, and the vertical axis represents an admittance. Characteristic 531 denotes the admittance of driving vibration 521 which is maximized at center frequency Fd. Characteristic 530 denotes the admittance of sensing vibration 522 which is maximized at center frequency Fs.

Upon angular velocity 523 being applied to, tuning folk vibrator 520 performs sensing signal S603 having sensing vibration frequency Fs and having an amplitude corresponding to angular velocity 523. Detector circuit 513 synchronously detects sensing signal S603 with using monitoring signal S601, thereby detecting value S501 based on characteristic 530.

Due to a certain cause, such as an impact from outside, tuning folk vibrator 520 may oscillate at a high-order mode, such as a third-order mode, or oscillate at a different natural resonance frequency. In this case, detector circuit 513 cannot detect angular velocity 523 properly. For example, when tuning folk vibrator 520 oscillates at a frequency three times as high as frequency Fd, i.e., at frequency (3×Fd), oscillator 511 performs driving vibration 521 denoted by characteristic 532 shown in FIG. 15. Monitoring signal S601 also has frequency (3×Fd). Therefore, when angular velocity 523 having the same amplitude is applied to oscillator 511, detector circuit 513 synchronously detects sensing signal S603 with using monitoring signal S601 having frequency (3×Fd), thereby providing value S502 different from value S501.

Figure 16A:
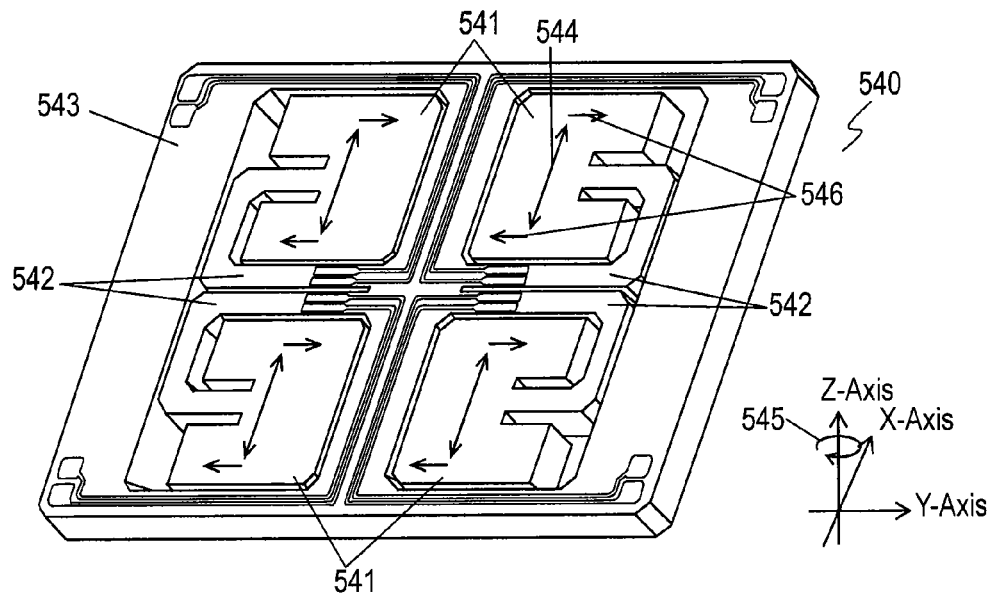
FIG. 16A is a perspective view of another oscillator in accordance with Embodiment 4.
Figure 16B:
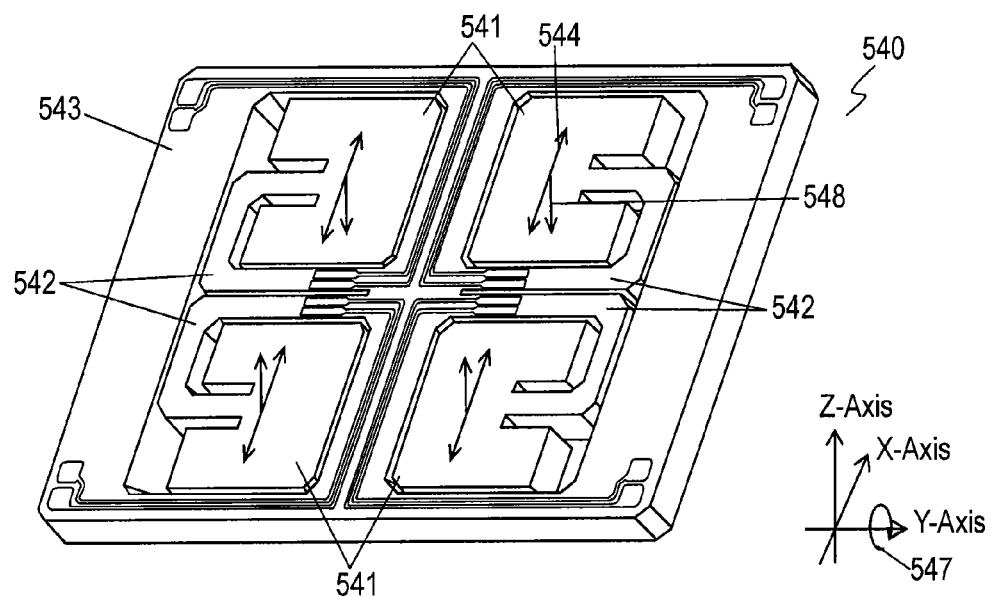
FIG. 16B is a perspective view of the oscillator shown in FIG. 16A.
Figure 26:
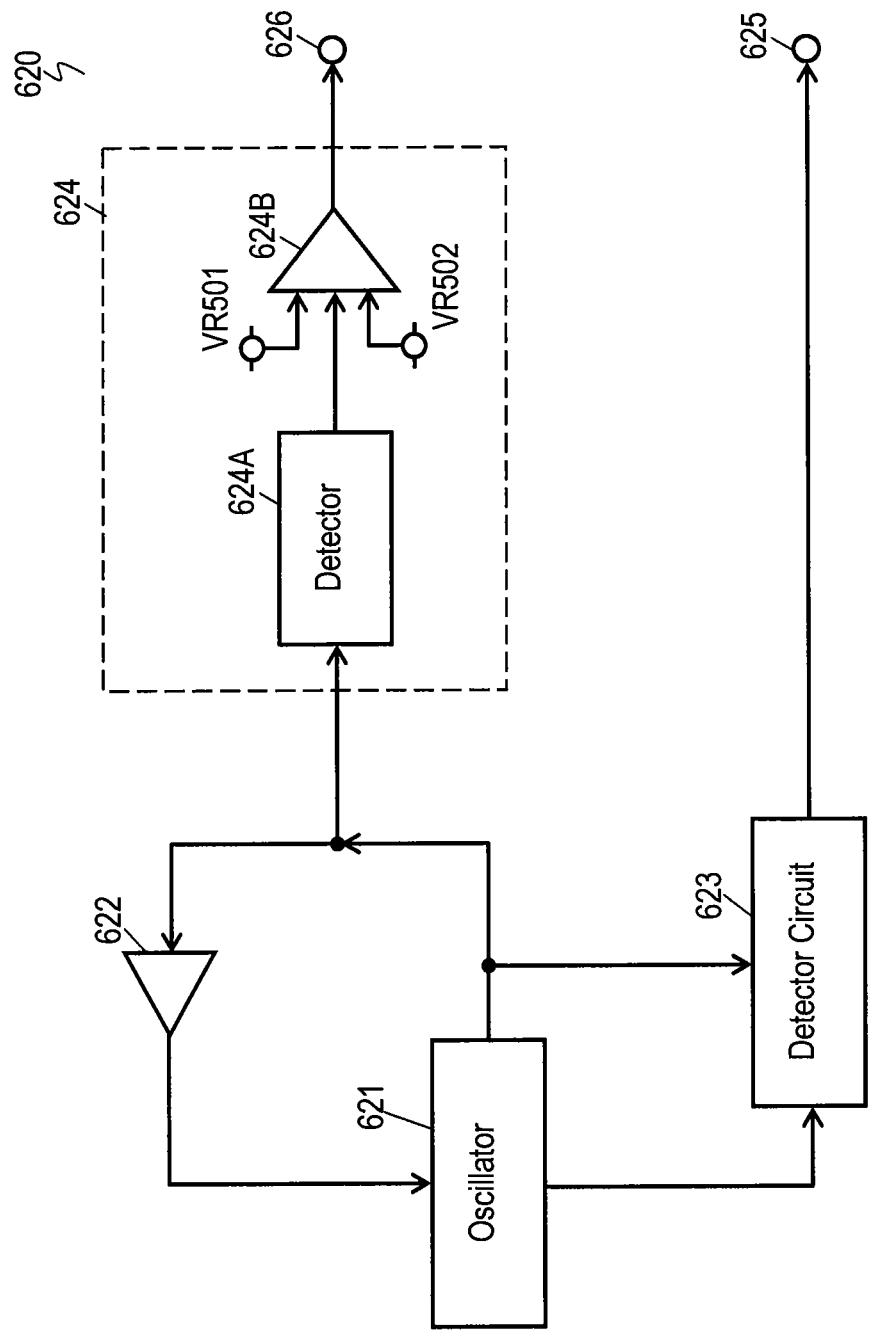
FIG. 26 is a circuit block diagram of a conventional inertial sensor.

Thus, during such an abnormal oscillation, angular velocity 523 is not detected correctly. However, since monitoring signal S601 has a constant amplitude, conventional inertial sensor 620 shown in FIG. 26 determines, based on the amplitude, whether or not an abnormal state is initiated, and outputs no abnormal-state detection signal. Therefore, an electronic device employing this sensor determines that the incorrect value of angular velocity provided by detector circuit 513 is a correct value FIGS. 16A and 16B are perspective views of multi-axis detection oscillator 540 used as oscillator 511. Oscillator 540 has four weights 541, supporter 543, and four flexible arms 542 that connect weights 541 to supporter 543. An operation of inertial sensor 510 shown in FIG. 13 including oscillator 540 as oscillator 11 will be described below. Upon a driving vibration in a direction of an X-axis being applied to, oscillator 540 can detect angular velocity 547 about a Y-axis and angular velocity 545 about a Z-axis. The Y-axis and Z-axis are perpendicular to each other, and perpendicular to the X-axis.

FIG. 16A shows an operation of multi-axis detection oscillator 540 for detecting angular velocity 545 about the Z-axis. When driver 512 applies driving signal S602 to multi-axis detection oscillator 540, weights 541 vibrate in the driving vibration mode in a direction of the X-axis, thus allowing oscillator 540 to perform driving vibration 544 at a natural resonance frequency of the driving vibration mode. When oscillator 540 receives angular velocity 545 about the Z-axis while performing driving vibration 544, a Coriolis force is produced to generate sensing vibration 546 in a direction of the Y-axis, hence allowing weights 541 to vibrate in the direction of the Y-axis. According to sensing vibration 546, oscillator 540 outputs sensing signal S603. Sensing signal S603 has a frequency identical to that of driving vibration 544 and has an amplitude that corresponds to angular velocity 545. Detector circuit 513 synchronously detects sensing signal S603 with using monitoring signal S601, thereby detecting angular velocity 45.

FIG. 16B shows an operation of multi-axis detection oscillator 540 for detecting angular velocity 547 about the Y-axis. When oscillator 540 receives angular velocity 547 about the Y-axis while performing driving vibration 544, a Coriolis force is produced to generate sensing vibration 548 in a direction of the Z-axis, hence allowing weights 541 to vibrate in the direction of the Z-axis. According to sensing vibration 548, oscillator 540 outputs sensing signal S603. Sensing signal S603 has a frequency identical to that of driving vibration 544 and has an amplitude that corresponds to angular velocity 547. Detector circuit 513 synchronously detects sensing signal S603 with using monitoring signal S601, thereby detecting angular velocity 547.

Multi-axis detection oscillator 540 has a complicated structure to move four weights 541 in the directions of the X-axis, Y-axis, and Z-axis. Due to the structure, oscillator 540 has plural undesired vibration modes, other than the driving vibration mode and the sensing vibration mode. Therefore, an impact applied from outside may cause oscillator 540 to perform an abnormal oscillation in an undesired vibration mode.

Inertial sensor 510 according to embodiment 4 determines an abnormal state and outputs an abnormal-state detection signal when oscillator 511 performs such abnormal vibration.

Figure 17A:
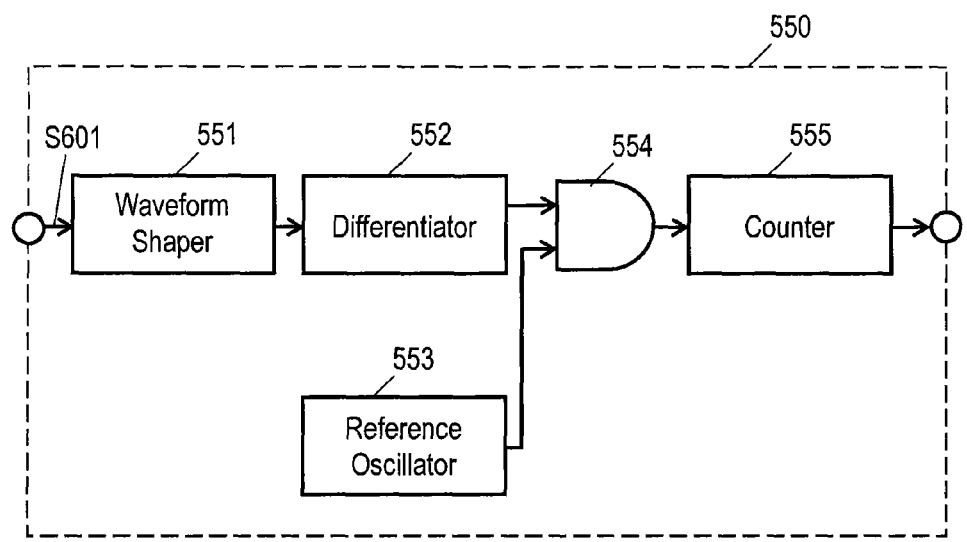
FIG. 17A is a circuit block diagram of a frequency measuring section of the oscillator circuit in accordance with Embodiment 4.

FIG. 17A is a circuit block diagram of frequency measuring section 550, frequency measuring section 514A for detecting the frequency of monitoring signal S601. Monitoring signal S601 has a sine wave having the driving vibration frequency. Frequency measuring section 550 includes a waveform shaper 551, a differentiator 552, a reference oscillator 553, an AND gate 554, and a counter 555. Waveform shaper 551 shapes the sine wave of monitoring signal S601 into a rectangular wave. Differentiator 552 differentiates the rectangular wave into monitoring pulse signals. Reference oscillator 553 outputs a reference signal. Receiving the monitoring pulse signals and the reference signal, AND gate 554 outputs pulse signals. Counter 555 counts the number of the pulse signals output from AND gate 554. The reference signal has a high level and a low level switched alternately at a predetermined duty ratio. AND gate 554 outputs a logical conjunction of the monitoring pulse signals and the reference signal. That is, AND gate 554 outputs the monitoring pulse signals within only a gate period in which the reference signal has the high level, while AND gate 554 doe not output the monitoring pulse signals during the reference signal has the low level. Frequency measuring section 550 detects the frequency of received monitoring signal S601 by counting the number of the monitoring pulse signals.

Frequency measuring section 550 is just an example of frequency measuring section 514A and is not to be construed as a limiting structure. For example, frequency measuring section 514A may output a voltage corresponding to difference in frequencies of monitoring signal S1 and the reference signal. Alternately, frequency measuring section 514A may analog/digital-converts monitoring signal S601 into a digital signal, and performs a fast Fourier conversion to the digital signal to analyze the frequency.

If frequency measuring section 514A receives monitoring signal S601 containing plural components of frequencies, frequency measuring section 514 cannot count each frequency individually. For example, when oscillator 511 has both a component of the driving vibration mode and a component of an abnormal vibration mode, monitoring signal S601 output from oscillator 511 contains the component of a predetermined driving vibration frequency and the component of an abnormal frequency caused by the abnormal vibration mode. In this case, frequency measuring section 514A mainly measures the frequency of a component having a larger amplitude. Besides, in the case that inertial sensor 510 includes a frequency divider connected to a pre-stage of frequency measuring section 514A, the frequency of the component having the larger amplitude is frequency-divided by the frequency divider and output to frequency measuring section 514A.

Figure 17B:
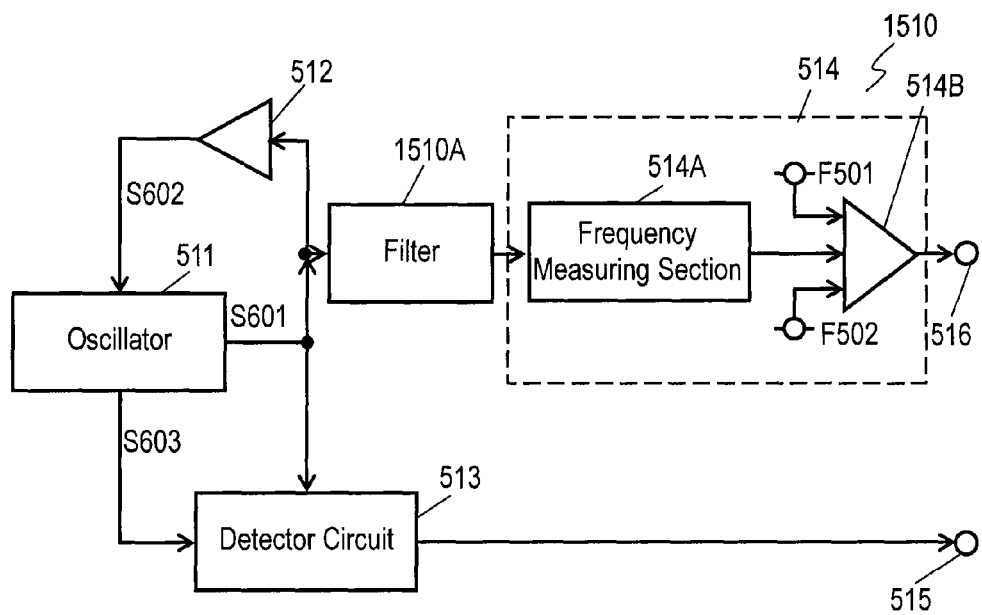
FIG. 17B is a circuit block diagram of another inertial sensor in accordance with Embodiment 4.

FIG. 17B is a circuit block diagram of another inertial sensor 1510 in accordance with Embodiment 4. In FIG. 17B, components identical to those of inertial sensor 510 shown in FIG. 13 are denoted by the same reference numerals. Inertial sensor 1510 shown in FIG. 17B further includes filter 1510A that filters monitoring signal S601 and outputs the filtered signal to frequency measuring section 514A. Filter 1510A is a band elimination filter that passes components other than the component having driving vibration frequency Fd. With the structure above, even if monitoring signal S601 contains plural components of frequencies, frequency measuring section 514A properly detects an abnormal frequency with no influence of the predetermined driving vibration frequency. Similarly, the frequency divider frequency-divides monitoring signal S601 with no influence of the predetermined driving vibration frequency. In the case that a frequency band of the abnormal vibration is predictable, filter 1510A may be a bandpass filter which passes signals with frequencies within the frequency band and suppresses signals with other frequencies.

Window comparator 514B compares the frequency value output from frequency measuring section 514A with upper threshold F501 and lower threshold F502 to determine whether the frequency of monitoring signal S601 is normal or abnormal.

Figure 18:
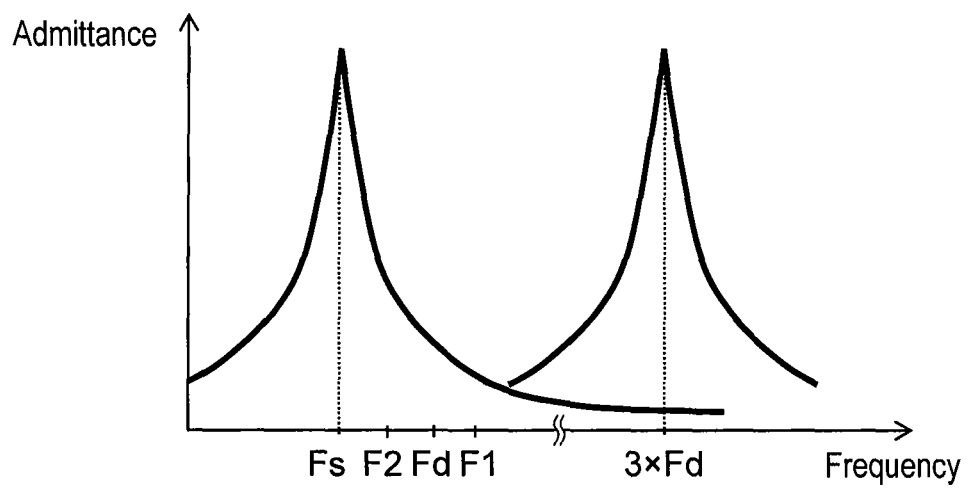
FIG. 18 shows a frequency characteristic of the oscillator in accordance with Embodiment 4.

An operation of abnormal-state detector 514 will be described below with reference to FIG. 18. FIG. 18 shows an admittance characteristic of oscillator 511. Frequency Fd is the predetermined driving vibration frequency. Upper threshold F501 of window comparator 514B is determined to be close to and higher than frequency Fd, while lower threshold F502 window comparator 514B is determined to be close to and lower than frequency Fd. Similarly to the admittance characteristic shown in FIG. 15, characteristic 532 represents the state where oscillator 511 performs an abnormal oscillation with frequency (3×Fd) that is three times as high as frequency Fd due to a certain cause, such as an impact from outside. Under the state, monitoring signal S601 also has frequency (3×Fd). Frequency measuring section 514A measures the frequency of monitoring signal S601 and outputs frequency (3×Fd). Window comparator 514B compares this frequency with upper threshold F501 and lower threshold F502. Since frequency (3×Fd) is higher than upper threshold F501, window comparator 514B outputs an abnormal-state detection signal to diagnostic terminal 516.

The abnormal-state detection signal output to diagnostic terminal 516 may be an analog signal or a digital signal. When the digital signal is employed, either a high level or a low level of the digital signal is predetermined as a signal representing the abnormal state. Alternatively, the digital signal may take a value, such as a predetermined abnormal detection code.

As described above, oscillator 511 outputs sensing signal S603 according to an amount of inertia applied from outside of oscillator 511 while performing a vibration and outputs monitoring signal S601 according to the vibration while being driven by driving signal S602. Driver 512 amplifies monitoring signal S601 to generate driving signals 602. Detector circuit 513 properly detects the amount of inertia according to sensing signal S603 while oscillator 511 vibrates at a predetermined driving vibration frequency. Abnormal-state detector 514 outputs the abnormal-state detection signal in the case that monitoring signal S601 contains a component which has a frequency different from the predetermined driving vibration frequency. Abnormal-state detector 514 may output the abnormal-state detection signal in the case that the monitoring signal contains the component which has the frequency different from the predetermined driving vibration frequency simultaneously to that the component has an amplitude not smaller than a predetermined amplitude.

Figure 19:
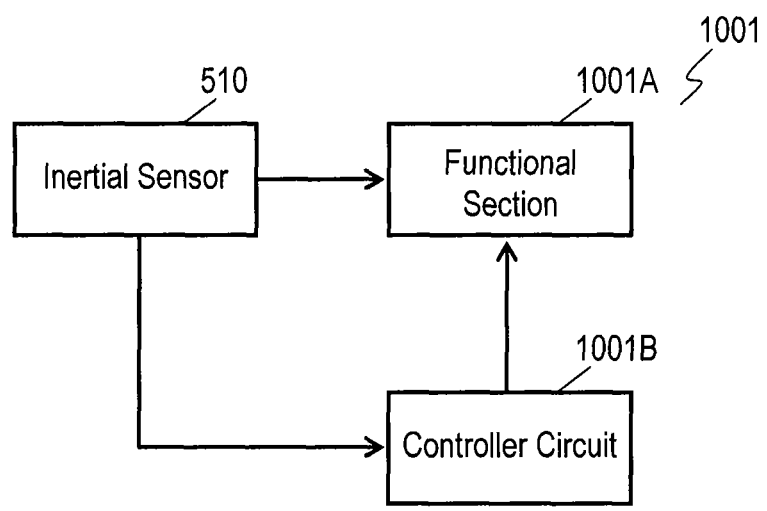
FIG. 19 is a block diagram of an electronic device including the inertial sensor in accordance with Embodiment 4.

FIG. 19 is a block diagram of electronic device 1001 in accordance with Embodiment 4. Electronic device 1001 includes inertial sensor 510, functional section 1001A, and controller circuit 1001B. Functional section 1001A operates based on the amount of inertia, such as angular velocity, detected by inertial sensor 510. Controller circuit 1001B controls functional section 1001A based on an abnormal-state detection signal output from inertial sensor 510. Functional section 1001A is, for example, as an actuator that controls an attitude of a vehicle. In this case, inertial sensor 510 detects rollover of the vehicle based on to an angular velocity as the amount of inertia, and functional section 1001A controls the attitude of the vehicle. As described above, when oscillator 511 vibrates at a frequency different from a predetermined driving vibration frequency, abnormal-state detector 514 outputs an abnormal-state detection signal from diagnostic terminal 516. Controller circuit 1001B can control functional section 1001A without using the amount of inertia output from output terminal 515 or partially with using the output amount of inertia while receiving the abnormal-state detection signal from diagnostic terminal 516. Functional section 1001A is thus controlled by inertial sensor 510 and controller circuit 1001B reliably.

In tuning-folk vibrator 520 and multi-axis detection oscillator 540, conversion from driving signal S602 into driving vibration 521, 544 and conversion from sensing vibration 522, 546, and 548 into sensing signal S603 is attained by a piezoelectric method, a capacitance method, or an electromagnetic drive method.

Employing a differential signal for driving signal S602 output from driver 512 to oscillator 511 provides inertial sensor 510 with large resistance against a common mode noise. Similarly, the differential signal for sensing signal S603 output from oscillator 511 to detector circuit 513 provides inertial sensor 510 with large resistance against a common mode noise.

Exemplary Embodiment 5

Figure 20:
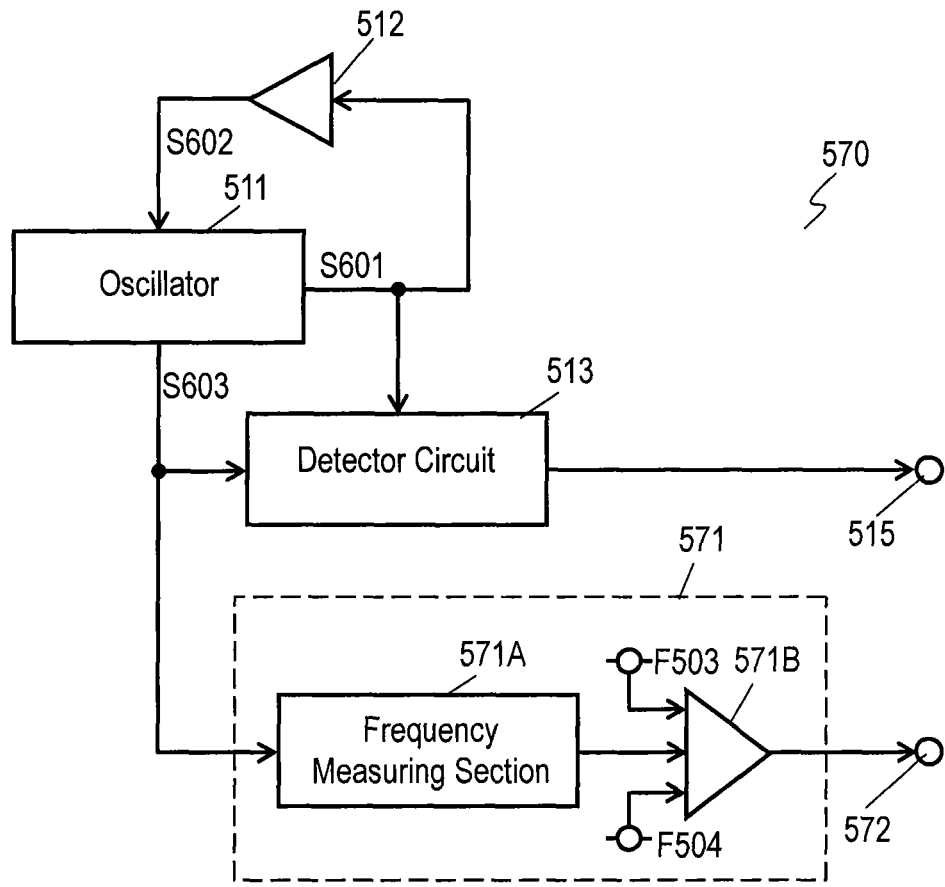
FIG. 20 is a circuit block diagram of an inertial sensor in accordance with Exemplary Embodiment 5 of the invention.

FIG. 20 is a circuit block diagram of inertial sensor 570 in accordance with Exemplary Embodiment 5 of the present invention. In FIG. 20, components identical to those of inertial sensor 510 of FIG. 13 according to Embodiment 4 are denoted by the same reference numerals. Inertial sensor 570 includes abnormal-state detector 571 instead of abnormal-state detector 514 of inertial sensor 510 shown in FIG. 13. Based on sensing signal S603 output from oscillator 511, abnormal-state detector 571 determines whether the driving vibration frequency is normal or not, and outputs an abnormal-state detection signal to diagnostic terminal 572.

Sensing signal S603 output from oscillator 511 contains not only a component of the vibration caused by the amount of inertia, such as an angular velocity, applied from outside, but also an MC component of vibration which is a component of the combination of the driving vibration mode and the sensing vibration mode. Since the MC component has a frequency and phase identical to those of the driving vibration frequency, the MC component is detected to determine whether the driving vibration frequency is normal or abnormal. Thus, an abnormality of the driving vibration frequency can be detected directly from sensing signal S603 which is essential to measure the amount of inertia. In the case that a filter is disposed upstream or downstream of driver 512 similarly to inertial sensor 20 shown in FIG. 2, if a component having an abnormal frequency contained in monitoring signal S601 is within an attenuation frequency band of the filter, abnormality cannot detected based on monitoring signal S601. Even in this case, abnormal-state detector 571 can detect abnormality by measuring the driving vibration frequency based on sensing signal S603.

Detector circuit 513 of inertial sensor 570 eliminates the MC component contained in sensing signal S603 and extracts only the component caused by the amount of inertia to detect the amount of inertia. An operation of detector circuit 513 will be described below. Inertial sensor 570 is an angular velocity sensor that detects an angular velocity applied to oscillator 511, similarly to inertial sensor 510 according to Embodiment 4.

Figure 21:
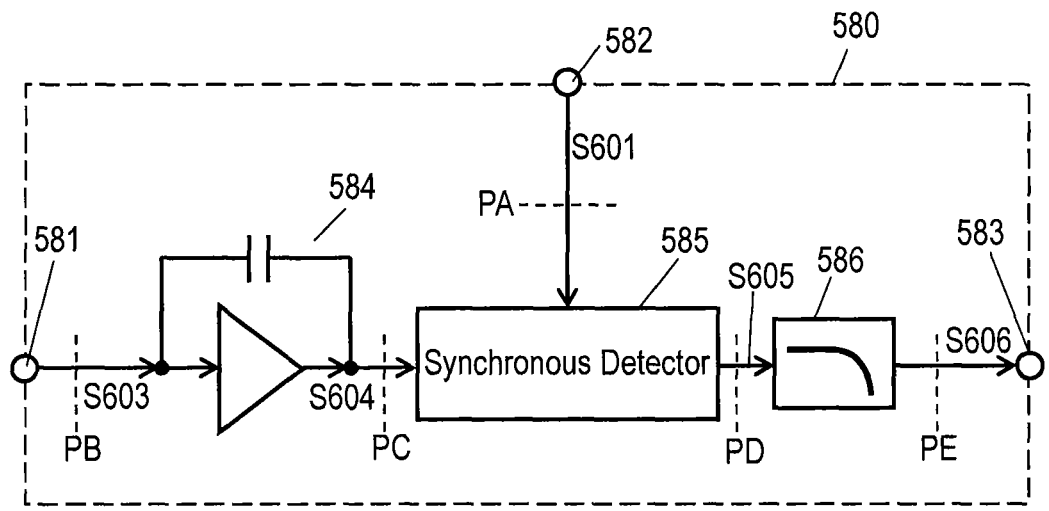
FIG. 21 is a circuit block diagram of a detector circuit of the inertial sensor in accordance with Embodiment 5.

FIG. 21 is a circuit block diagram of detector circuit 580, detector circuit 513. Detector circuit 580 includes input terminals 581 and 582, phase shifter 584, synchronous detector 585, and low-pass filter 586. Input terminal 581 receives sensing signal S603, and input terminal 582 receives monitoring signal S601. Phase shifter 584 shifts the phase of sensing signal S603 output from input terminal 581 by −90°, and outputs the signal having the shifted phase. Synchronous detector 585 synchronously detects the signal output from phase shifter 584 with using monitoring signal S601. Low-pass filter 586 smoothes the signal detected by synchronous detector 585 and outputs the smoothed signal to output terminal 583.

Figure 22B:
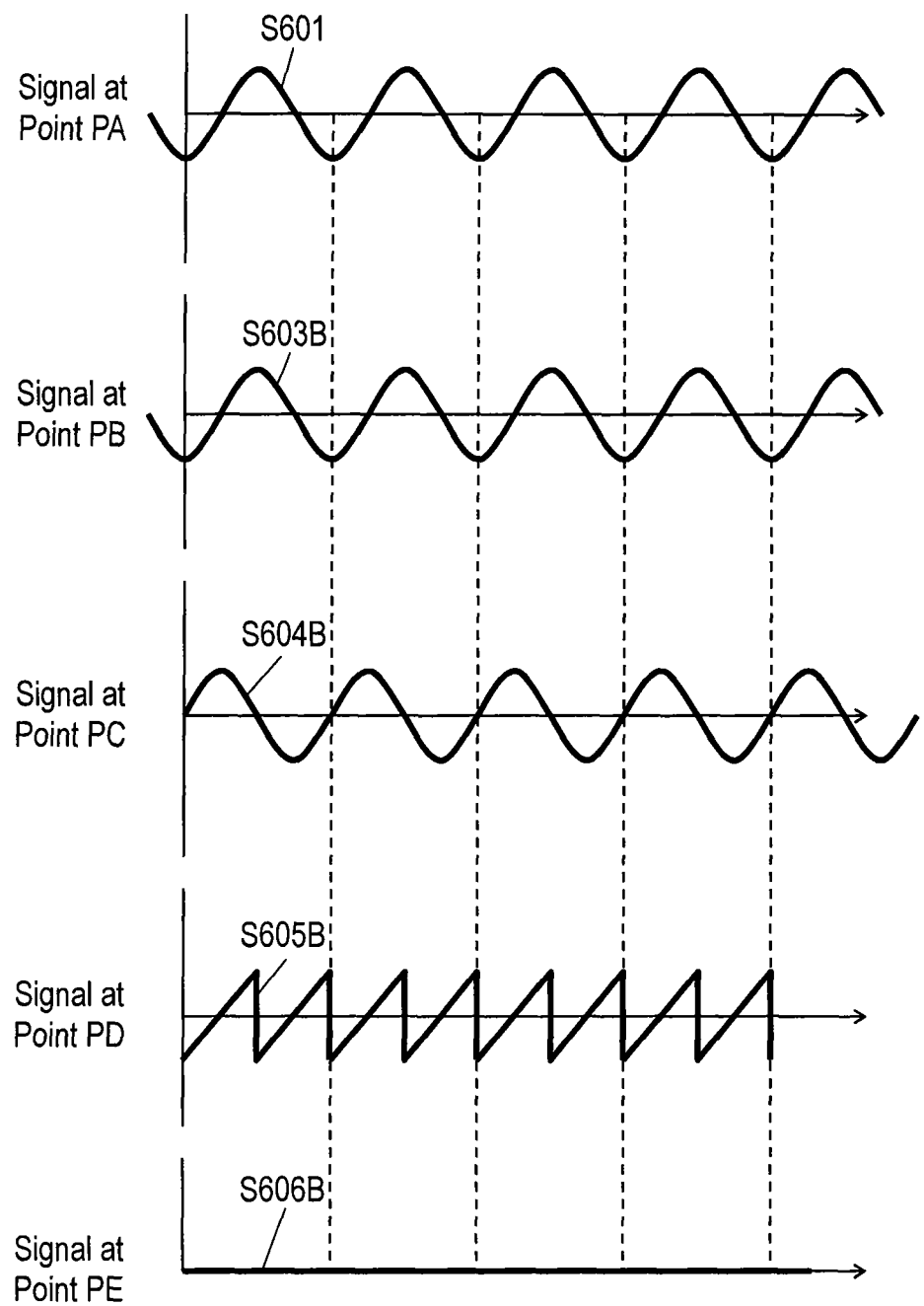
FIG. 22B shows waveforms of signals of the detector circuit in accordance with Embodiment 5.

FIGS. 22A and 22B shows waveforms of signals at points PA, PB, PC, PD, and PE of inertial sensor 570 shown in FIG. 21.

FIG. 22A shows waveforms of components of signals at points PA to PE according to the amount of inertia, i.e., the angular velocity.

FIG. 22A shows monitoring signal S601 at point PA, and further shows component S603A of the amount of inertia at point PB contained in sensing signal S603. Component S603A has a frequency identical to that of monitoring signal S601 and has a phase advancing from monitoring signal S601 by 90°. Component S603A of the amount of inertia of sensing signal S603 has an amplitude that depends on the angular velocity as the amount of inertia applied from outside.

FIG. 22A further shows component S604A of the amount of inertia of signal S604 at point PC having a phase shifted by phase shifter 584. Having a phase shifted by −90°, component S604A of the amount of inertia has a phase identical to that of monitoring signal S601.

FIG. 22A further shows component 605A of the amount of inertia of signal S605 at point PD output from synchronous detector 585. Synchronous detector 585 synchronously detects signal S604A as the component of the amount of inertia of signal S604, output from phase shifter 584, with using monitoring signal S601, thereby outputs component S605A of the amount of inertia of signal S605. Further, low-pass filter 586 smoothes component S605A to provide component S606A of the amount of inertia of signal S606. Component S606A is output from output terminal 583 as a direct-current (DC) signal corresponding to the angular velocity as the amount of inertia.

FIG. 22B shows waveforms of the MC component contained in sensing signal S603 at points PA through PE.

FIG. 22B shows monitoring signal S601 at point PA. The signal at point PB is MC component S603B contained in sensing signal S603. MC component S603A has a frequency and phase identical to those of monitoring signal S601.

FIG. 22B further shows MC component S604B of signal S604 at point PC having a phase shifted by phase shifter 584. Having the phase shifted by −90°, MC component S604B has a phase delaying from monitoring signal S601 by 90°.

FIG. 22B further shows MC component S605B of signal S605 at point PD output from synchronous detector 585. Synchronous detector 585 synchronously detects, with using monitoring signal S601, MC component S604B of signal S604 output from phase shifter 584, thereby providing MC component S605B of signal S605. Low-pass filter 586 smoothes MC component S605B to obtain MC component S606B of signal S606 at point PD. As shown in FIG. 22B, MC component S606B is zero.

In the above process, detector circuit 513 eliminates the MC component contained in sensing signal S603 to extract only component S606A of the amount of inertia, i.e., the angular velocity, and output component S606A from output terminal 583 which is a DC signal.

Based on component S603A of the amount of inertia of sensing signal S603, abnormal-state detector 571 determines whether the driving vibration frequency of oscillator 511 is normal or not. In this case, a predetermined angular velocity as the amount of inertia is applied to oscillator 511 from outside, and then, it is necessary to determine whether the amount of inertia output from detector circuit 513 has an appropriate value or not.

Sensing signal S603 contains MC component S603B having a predetermined amount even if an amount of inertia, such as an angular velocity, is not applied to oscillator 511. In inertial sensor 570 according to Embodiment 5, frequency measuring section 571A measures the frequency of MC component S603B, and window comparator 571B determines whether the driving vibration frequency of oscillator 511 is normal or not.

In abnormal-state detector 571, as shown in FIG. 20, frequency measuring section 571A measures the frequency of sensing signal S603 output from oscillator 511. If the measured frequency is not lower than upper threshold F503 or not higher than lower threshold F504, window comparator 571B outputs an abnormal-state detection signal. For example, frequency measuring section 550 shown in FIG. 17A can be used as frequency measuring section 571A.

MC component S603B has a phase identical to that of monitoring signal S601. Abnormal-state detector 571 extracts MC component S603B from sensing signal S603 and measures the frequency of MC component S603B, thereby providing abnormal-state detection with high reliability. Besides, when detector circuit 513 outputs an amount of inertia of zero, i.e., when an angular velocity is not applied to oscillator 511, abnormal-state detector 571 detects an abnormal state. This operation allows abnormal-state detector 571 to attain abnormal-state detection of the driving vibration frequency based only on MC component S603B with no influence of component S603A as the amount of inertia of sensing signal S603. As described above, oscillator 511 outputs sensing signal S603 according to an amount of inertia applied from outside of oscillator 511 while performing a vibration, and outputs monitoring signal S601 according to the vibration while being driven by driving signal S602. Driver 512 amplifies monitoring signal S601 to generate driving signal S602. Detector circuit 513 properly detects the amount of inertia based on sensing signal S513 while oscillator 511 vibrates at a predetermined driving vibration frequency. Abnormal-state detector 571 outputs an abnormal-state detection signal in the case that sensing signal S603 contains a component which has a phase identical to a phase of monitoring signal S501 and which has a frequency different from the predetermined driving vibration frequency. Abnormal-state detector 571 may output the abnormal-state detection signal in the case that sensing signal S603 contains the component which has the phase identical to the phase of monitoring signal S601 and which has the frequency different from the predetermined driving vibration frequency simultaneously to that the component has an amplitude not smaller than a predetermined amplitude.

Exemplary Embodiment 6

Figure 23:
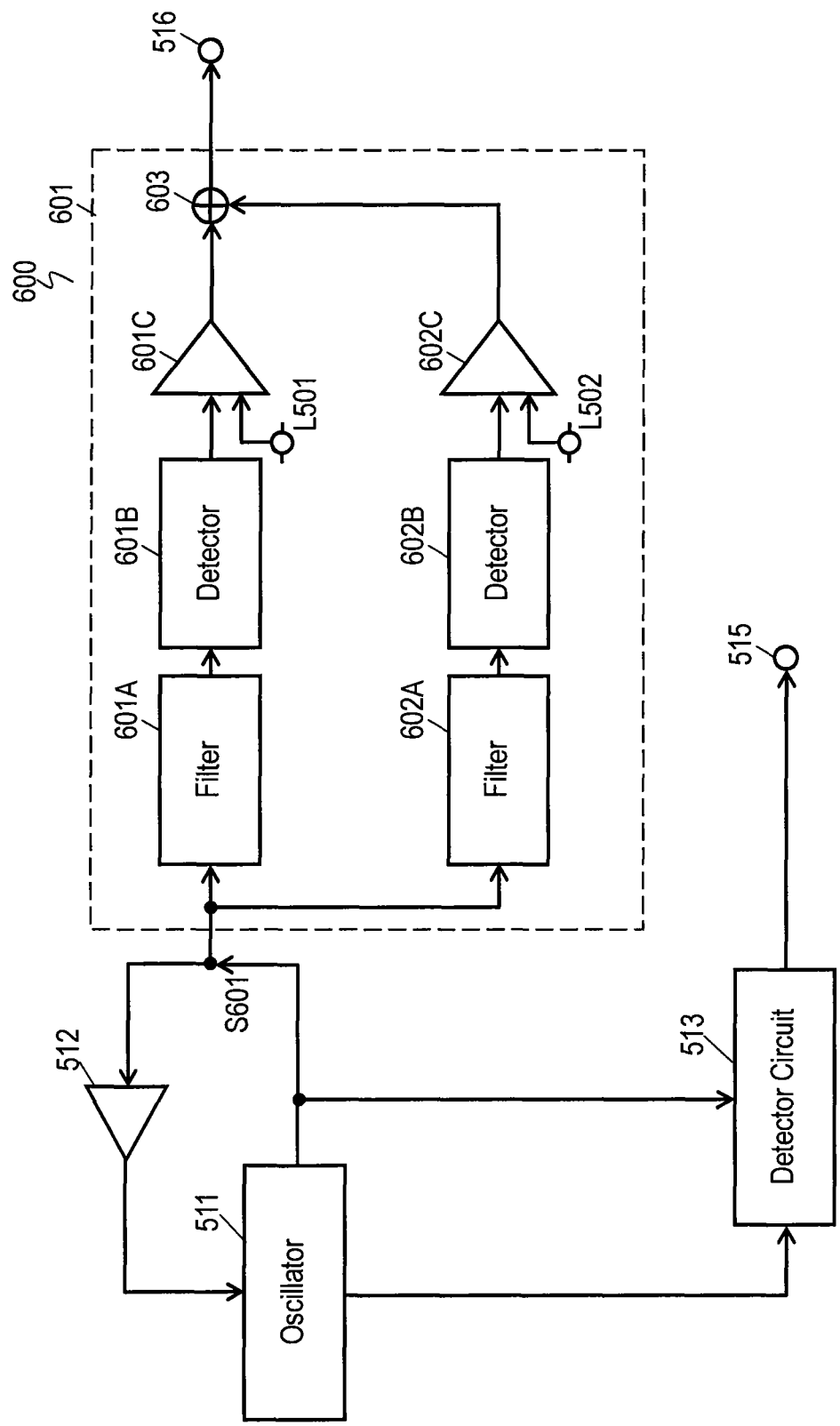
FIG. 23 is a circuit block diagram of an inertial sensor in accordance with Exemplary Embodiment 6 of the invention.

FIG. 23 is a circuit block diagram of inertial sensor 600 according to Exemplary Embodiment 6 of the present invention. In FIG. 23, components identical to those of inertial sensor 510 shown in FIG. 13 according to Embodiment 4 are denoted by the same reference numerals. Inertial sensor 600 includes abnormal-state detector 601 instead of abnormal-state detector 514 of inertial sensor 510 shown in FIG. 13.

Abnormal-state detector 601 includes filter 601A, detector 601B, and comparator 601C. Filter 601A receives monitoring signal S601. Detector 601B detects the amplitude of the signal output from filter 601A. If the amplitude is not smaller than upper threshold L501, comparator 601C outputs an abnormal-state detection signal. Abnormal-state detector 601 further includes filter 602A, detector 602B, comparator 602C, and OR gate 603. Filter 602A receives monitoring signal S601. Detector 602B detects the amplitude of the signal output from filter 602A. If the amplitude is not smaller than upper threshold L502, comparator 602C outputs an abnormal-state detection signal. If receiving the abnormal-state signal output from at least one of comparators 601C and 602C, OR gate 603 outputs the abnormal-state signal. Both of filter 601A and filter 602A are bandpass filters that pass signals having frequencies within predetermined passing frequency bands which do not include a predetermined driving vibration frequency, and suppress signals with frequencies within a frequency band other than the predetermined frequency band. Filter 601A has a predetermined passing frequency band different from that of filter 602A.

In the case that a frequency causing oscillator 511 to oscillate abnormally is previously known, the passing frequency bands of bandpass filters 601A and 602A are determined to contain the frequency. This setting of the passing frequency bands, abnormal-state detector 601 performs abnormal detection accurately.

If the amplitude of monitoring signal S601 is smaller than lower thresholds L501 and L502, diagnostic terminal 516 does not output the abnormal-state signal. Even if each passing band of filters 601A and 602A contains a certain signal having a small level which does not affect the detection of the amount of inertia, lower thresholds L501 and L502 can be determined such that the abnormal-state signal is not output from diagnostic terminal 516.

Filter 601A may be a high-pass filter that passes signals having frequencies higher than the driving vibration frequency. Filter 602A may be a low-pass filter that passes signals having frequencies lower than the driving vibration frequency.

Figure 24:
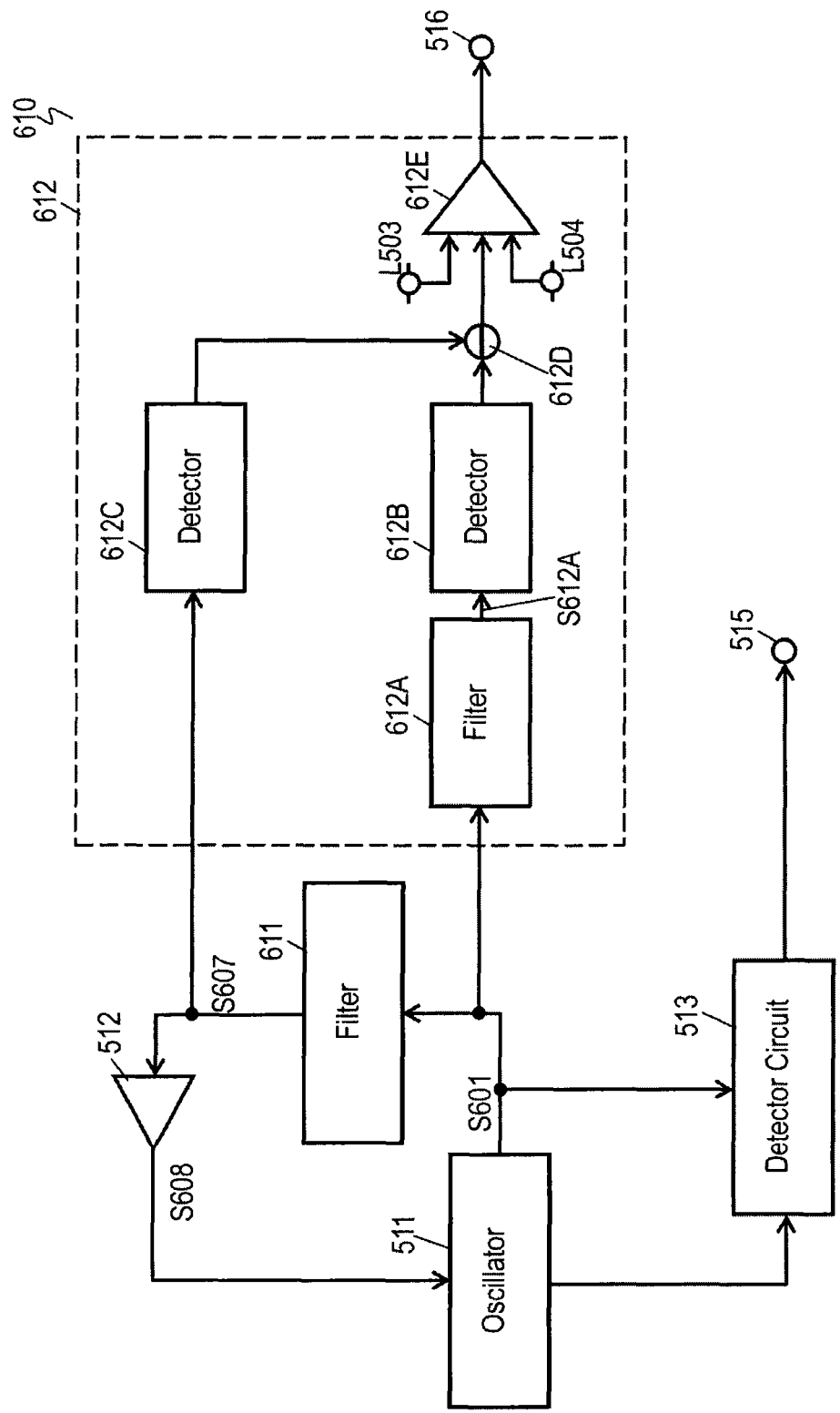
FIG. 24 is a circuit block diagram of another inertial sensor in accordance with Embodiment 6.

FIG. 24 is a circuit block diagram of another inertial sensor 610 according to Embodiment 6. In FIG. 24, components identical to those of inertial sensor 510 shown in FIG. 13 according to Embodiment 4 are denoted by the same reference numerals. Inertial sensor 610 shown in FIG. 24 includes abnormal-state detector 612 instead of abnormal-state detector 514 of inertial sensor 510 according to Embodiment 1, and further includes filter 611.

Filter 611 is a bandpass filter with a passing frequency band that contains a predetermined driving vibration frequency. Filter 611 filters monitoring signal S601 output from oscillator 511 within the passing frequency band, and outputs filtered signal S607 to driver 512. Driver 512 amplifies filtered signal S607 to generate driving signal S608. Oscillator 511 is driven by driving signal S608. This structure allows oscillator 511 to vibrate stably even if monitoring signal S601 contains a component with a frequency different from the driving vibration frequency.

If the difference between amplitudes of monitoring signal S601 input to filter 611 and filtered signal S607 is out of a predetermined range, abnormal-state detector 612 outputs an abnormal-state detection signal. Specifically, band elimination filter (BEF) 612A suppresses components of monitoring signal S601 with frequencies within the predetermined frequency band which does not contain the driving vibration frequency, and outputs filtered signal S612A. Detector 612B outputs the amplitude of filtered signal S612A output from band elimination filter 612. Detector 612C outputs the amplitude of filtered signal S607 output from filter 611. Subtractor 612D outputs a difference calculated by subtracting the amplitude obtained by detector 612C from the amplitude obtained by detector 612B. If the difference output from substratcor 612D is not smaller than upper threshold L503 or not larger than lower threshold L504, window comparator 612E outputs an abnormal-state detection signal.

The inertial sensors according to Embodiments 4 to 6 are angular velocity sensors, but widely applicable to sensors, such as acceleration sensors and gas sensors, that measure physical quantity with using the oscillator circuit, and also applicable to actuators, such as a driving device for driving a micro-electromechanical system (MEMS) mirror in an image projector, for converting an electrical signal into a mechanical operation These inertial sensors have a reliable abnormal detecting function, hence being useful for inertial sensors for vehicles for controlling vehicle attitude and detecting rollover.

INDUSTRIAL APPLICABILITY

An oscillator circuit according to the present invention allows the oscillator to oscillate stably, and is suitable for a sensor and an actuator used for electronic devices, such as a digital camera and a car navigation system.

REFERENCE MARKS IN THE DRAWINGS

11 Oscillator
12 Filter
13 Driver
14 Controller
20 Inertial Sensor
21 Detector Circuit
102 Controller
123 Controller
130 Oscillator Circuit
131 Oscillator
132 Filter
133 Driver
510 Inertial Sensor
511 Oscillator
512 Driver
513 Detector Circuit
514 Abnormal-State Detector
550 Frequency Measuring Section
570 Inertial Sensor
571 Abnormal-State Detector
580 Detector Circuit
600 Inertial Sensor
601 Abnormal-State Detector
610 Inertial Sensor
612 Abnormal-State Detector
624 Abnormal-State Detector

The invention claimed is:

1. An oscillator circuit comprising:
an oscillator that vibrates while being driven by a driving signal, and outputs a monitoring signal according to the vibration;
a filter that filters the monitoring signal and outputs the filtered signal;
a driver that amplifies the filtered signal to generate the driving signal; and
a controller for controlling a passing characteristic of the filter based on the monitoring signal,
the controller adjusts a center frequency of a passing frequency band of the filter based on a frequency of the monitoring signal,
the oscillator further vibrates with a sensing vibration according to an amount of inertia applied from outside of the oscillator, and
the controller adjusts the center frequency of the passing frequency band of the filter so as to cause the center frequency to become: a) lower than the frequency of the monitoring signal when a frequency of the sensing vibration is higher than the frequency of the monitoring signal, and b) higher than the frequency of the monitoring signal when the frequency of the sensing vibration is lower than the frequency of the monitoring signal.

2. The oscillator circuit according to claim 1, wherein the controller is operable to adjust a phase characteristic of the filter such that a phase difference between the monitoring signal and the filtered signal is equal to a predetermined phase difference.

3. The oscillator circuit according to claim 2,
wherein the controller includes a frequency measuring section including a reference oscillator for generating a reference signal, and
wherein the reference oscillator is incorporated with the filter and the driver in a chip.

4. The oscillator circuit according to claim 1,
wherein the controller includes a frequency measuring section including a reference oscillator for generating a reference signal,
wherein the reference oscillator has a Q factor larger than a Q factor of the oscillator circuit, and
wherein the frequency measuring section measures the frequency of the monitoring signal based on the reference signal.

5. The oscillator circuit according to claim 4, wherein the reference oscillator is incorporated with the filter and the driver in a chip.

6. The oscillator circuit according to claim 1,
wherein the controller includes a frequency measuring section including a reference oscillator for generating a reference signal,
wherein the reference oscillator has variations of processing accuracy smaller than variations of processing accuracy of the oscillator circuit, and
wherein the frequency measuring section measures the frequency of the monitoring signal based on the reference signal.

7. The oscillator circuit according to claim 6, wherein the reference oscillator is incorporated with the filter and the driver in a chip.

8. The oscillator circuit according to claim 1,
wherein the controller includes a frequency measuring section including a reference oscillator for generating a reference signal,
wherein the reference oscillator has a frequency-temperature coefficient smaller than a frequency-temperature coefficient of the oscillator circuit, and
wherein the frequency measuring section measures the frequency of the monitoring signal based on the reference signal.

9. The oscillator circuit according to claim 8, wherein the reference oscillator is incorporated with the filter and the driver in a chip.

10. The oscillator circuit according to claim 1,
wherein the controller includes a frequency measuring section including a reference oscillator for generating a reference signal, and
wherein the reference oscillator is incorporated with the filter and the driver in a chip.

11. An inertial sensor comprising:
an oscillator circuit according to claim 1; and
a detector circuit that detects a signal output from the oscillator,
wherein the oscillator performs a sensing vibration according to an amount of inertia applied from outside of the oscillator and outputs a sensing signal according to the sensing vibration, and
wherein the detector circuit detects the sensing signal output from the oscillator.

12. An oscillator circuit comprising:
an oscillator vibrates while being driven by a driving signal and outputs a monitoring signal according to the vibration;
a filter that filters the monitoring signal and outputs the filtered signal; and
a driver that amplifies the filtered signal to generate the driving signal,
wherein, a passing characteristic of the filter is adjusted based on the monitoring signal,
the oscillator further vibrates with a sensing vibration according to an amount of inertia applied from outside of the oscillator, and a center frequency of a passing frequency band of the filter becomes: a) lower than a frequency of the monitoring signal when a frequency of the sensing vibration is higher than the frequency of the monitoring signal, and b) higher than the frequency of the monitoring signal when the frequency of the sensing vibration is lower than the frequency of the monitoring signal.

13. The oscillator circuit according to claim 12,
wherein the passing characteristic of the filter includes a phase characteristic,
wherein the phase characteristic is adjusted such that a phase difference between the monitoring signal and the filtered signal is equal to a predetermined phase difference.

14. A method of operating an oscillator circuit, which includes
an oscillator that performs a vibration while being driven by a driving signal and outputs a monitoring signal according to the vibration,
a filter that filters the monitoring signal and outputs the filtered signal, and
a driver that amplifies the filtered signal to generate the driving signal;
said method comprising the steps of:
adjusting a passing characteristic of the filter based on the monitoring signal; and
causing the oscillator to perform a sensing vibration according to an amount of inertia applied from outside of the oscillator,
wherein said adjusting of the passing characteristic of the filter based on the monitoring signal includes the step of
adjusting a center frequency of a passing frequency band of the filter so as to cause the center frequency to become:
a) lower than the frequency of the monitoring signal when a frequency of the sensing vibration is higher than a frequency of the monitoring signal; and
b) higher than the frequency of the monitoring signal when the frequency of the sensing vibration is lower than the frequency of the monitoring signal.

15. An oscillator circuit, comprising:
an oscillator that outputs a sensing signal according to an amount of inertia applied from outside of the oscillator while performing a vibration while being driven by a driving signal, and outputs a monitoring signal according to the vibration;
a driver that amplifies the monitoring signal to generate the driving signal;
a detector circuit that properly detects the amount of inertia based on the sensing signal while the oscillator vibrates at a predetermined driving vibration frequency;
an abnormal-state detector that outputs an abnormal-state detection signal in a case that the monitoring signal has a frequency different from the predetermined driving vibration frequency;
a filter that filters the monitoring signal and outputs the filtered signal; and
a controller for controlling a passing characteristic of the filter based on the monitoring signal,
the driver that amplifies the filtered monitoring signal to generate the driving signal,
the controller adjusts a center frequency of a passing frequency band of the filter based on a frequency of the monitoring signal,
the oscillator further vibrates with a sensing vibration according to an amount of inertia applied from outside of the oscillator, and
the controller adjusts the center frequency of the passing frequency band of the filter so as to cause the center frequency to become: a) lower than the frequency of the monitoring signal when a frequency of the sensing vibration is higher than the frequency of the monitoring signal, and b) higher than the frequency of the monitoring signal when the frequency of the sensing vibration is lower than the frequency of the monitoring signal.

* * * * *